United States Patent
Hansen

(10) Patent No.: US 7,137,714 B2
(45) Date of Patent: Nov. 21, 2006

(54) APPARATUS FOR OPTICAL BEAM SHAPING AND DIFFUSING AND ASSOCIATED METHODS

(75) Inventor: Matthew E. Hansen, Ridgefield, CT (US)

(73) Assignee: ASML Holding N.V., Veldhoven (NL)

( * ) Notice: Subject to any disclaimer, the term of this patent is extended or adjusted under 35 U.S.C. 154(b) by 0 days.

(21) Appl. No.: 11/114,189

(22) Filed: Apr. 26, 2005

(65) Prior Publication Data

US 2005/0190451 A1  Sep. 1, 2005

Related U.S. Application Data

(62) Division of application No. 10/131,185, filed on Apr. 25, 2002.

(60) Provisional application No. 60/286,533, filed on Apr. 27, 2001.

(51) Int. Cl.
*G02B 27/00* (2006.01)
(52) U.S. Cl. .................... 359/613; 359/601
(58) Field of Classification Search ............. 359/613, 359/599, 601, 615
See application file for complete search history.

(56) References Cited

U.S. PATENT DOCUMENTS

| | | | |
|---|---|---|---|
| 5,553,174 A | 9/1996 | Snyder | |
| 5,610,733 A | 3/1997 | Feldman et al. | |
| 5,663,980 A | 9/1997 | Adachi | |
| 5,706,134 A * | 1/1998 | Konno et al. | ............ 359/599 |
| 5,756,981 A | 5/1998 | Roustaei et al. | |
| 5,811,021 A * | 9/1998 | Zarowin et al. | ............ 216/67 |
| 5,814,885 A * | 9/1998 | Pogge et al. | ............ 257/730 |
| 5,850,300 A | 12/1998 | Kathman et al. | |
| 5,923,425 A | 7/1999 | Dewa et al. | ............ 356/520 |
| 5,962,195 A | 10/1999 | Yen et al. | |
| 6,014,361 A | 1/2000 | Nagashima et al. | |
| 6,021,009 A | 2/2000 | Borodovsky et al. | |
| 6,025,938 A | 2/2000 | Kathman et al. | |
| 6,069,739 A | 5/2000 | Borodovsky et al. | |
| 6,075,627 A | 6/2000 | Feldman et al. | |
| 6,075,650 A | 6/2000 | Morris et al. | |
| 6,166,389 A * | 12/2000 | Shie et al. | ............ 250/504 R |
| 6,256,146 B1 | 7/2001 | Merrill et al. | ............ 359/500 |

(Continued)

*Primary Examiner*—Drew A. Dunn
*Assistant Examiner*—Joshua L. Pritchett
(74) *Attorney, Agent, or Firm*—Sterne, Kessler, Goldstein & Fox P.L.L.C.

(57) ABSTRACT

This invention relates to an apparatus for optical beam shaping and diffusing, a method for making the apparatus, and a method for using the apparatus. The apparatus comprises a crystalline material object shaped to fit within an optical train and with a pattern of surface texture along an optical path. Surface removal processes are applied to a portion of a surface of an object made of a crystalline material to form a surface texture pattern at that portion of the surface of the object. The surface texture pattern depends upon: (1) the identity of the crystalline material and (2) the orientation of crystal lattice axes within the object with respect to the portion of the surface of the object where the pattern of surface texture is to be formed. Processes for making the apparatus include, but are not limited to, mechanical grinding, ablating, chemical etching, plasma etching, ion milling, and combinations thereof. The arrangement of the pattern of surface texture can be refined by coupling lithographic patterning methods with any of the surface removal processes. The apparatus can be used to change one or more of: (1) a shape, (2) an orientation, (3) an aspect ratio, (4) an angular pupil distribution, and (5) an intensity profile of a cross section of an optical beam.

12 Claims, 26 Drawing Sheets

U.S. PATENT DOCUMENTS 6,333,817 B1  12/2001  Kashima et al.

6,483,976 B1  11/2002  Shie et al. .................. 385/133

* cited by examiner

APPARATUS FOR OPTICAL BEAM SHAPING AND DIFFUSING AND ASSOCIATED METHODS

CROSS-REFERENCE TO RELATED APPLICATIONS

This application is a division of U.S. application Ser. No. 10/131,185, filed Apr. 25, 2002, which claims the benefit of U.S. Provisional Application No. 60/286,533, filed Apr. 27, 2001, which is incorporated herein by reference in its entirety.

BACKGROUND OF THE INVENTION

1. Field of the Invention

This invention relates to an apparatus for optical beam shaping and diffusing, a method for making the apparatus, and a method for using the apparatus.

2. Related Art

The ability to fabricate integrated circuit chips with increasingly smaller feature sizes depends upon continual evolution of photolithographic methods. Typically, a light source is used to illuminate a mask (reticle) so that a pattern is transferred into photoresist applied to an underlying semiconductor wafer. Machines that performs this operation are referred to as wafer steppers or wafer scanners. In order to achieve an accurate representation of the reticle pattern at submicron dimensions on the photoresist, it is necessary to use a light source that can support both a high degree of resolution and depth of focus. This requirement has led to the use of lasers as light sources for photolithographic applications.

However, the use of laser light for photolithography is not without its drawbacks. The pursuit of ever smaller feature sizes has focused semiconductor industry efforts on reducing the wavelength, rather than on boosting the penetrating power, of the impinging light. Therefore, state-of-the-art photolithographic processes now depend on wavelengths in the deep ultraviolet and far ultraviolet ranges. At these wavelengths, optical elements made of traditional amorphous materials, such as glass, cannot support optical transmission. Hence, optical elements in an optical train now must be made of crystalline materials that can support optical transmission.

Additionally, a cross section of a beam of light emitted from a laser source usually has an elliptical or substantially rectangular shape. Furthermore, an intensity profile across the cross section typically resembles a Gaussian distribution. Also, the rate at which the intensity tapers off (from its peak value near the center of the cross section) in one dimension can be different from the rate at which it decreases in an orthogonal dimension. Left uncorrected, the combined action of these various attributes can effect the degree of exposure of the photoresist which, in turn, can cause variations in linewidth dimensions of photolithographic patterns and the resulting electronic elements formed on the semiconductor wafer. Where these variations in linewidth dimensions are such that there is a difference between linewidth dimensions for horizontal lines and linewidth dimensions for vertical lines, the condition is referred to as horizontal-vertical (H-V) bias. Because H-V bias can effect the performance of an integrated circuit, methods for improving the control of variations in linewidth dimensions have been the subject of assorted efforts.

U.S. Pat. No. 5,962,195 teaches a method that uses two layers of photoresist, two exposure steps, and two etching steps. A light source illuminates a mask (reticle) so that a pattern is transferred into the topmost photoresist layer. The topmost photoresist layer is then etched by a first method to form a mask for an underlying photoresist layer. The underlying photoresist layer is resistant to the first etch method. Next, the light source illuminates the photoresist mask so that a pattern is transferred into the underlying photoresist layer. The underlying photoresist layer is then etched by a second method to pattern electronic elements onto a semiconductor wafer. This two-exposure, two-etch process acts to improve control of variations in linewidth dimensions of the electronic elements patterned on the semiconductor wafer.

U.S. Pat. No. 6,021,009 describes a technique for controlling linewidth dimensions directed towards homogenizing an intensity profile of an optical beam used for photolithography. The technique taught, however, realizes homogenization by absorbing light, with an optical compensator, at the areas of peak intensity within the intensity profile, thus reducing an overall intensity of the optical beam.

In a more general sense, the ability to shape a cross section of an optical beam or alter its intensity profile can be desirable for a variety of optics applications including, but not limited to, material ablation, micromachining, corneal sculpting, microsurgery, microbiology research, optical actuators, optical networks, and optical communications.

Several techniques have been developed for shaping a cross section of an optical beam.

U.S. Pat. No. 5,553,174 discloses a cylindrical minilens placed in an optical train after a collimating lens. The collimating lens receives an optical beam and collimates it along one dimension. The cylindrical minilens receives the optical beam from the collimating lens, collimates it along an orthogonal dimension, and expands or reduces it along the orthogonal dimension to shape the cross section of the optical beam.

U.S. Pat. Nos. 5,663,980 and 6,014,361 both teach an optical train that uses a prism to shape a cross section of an optical beam.

U.S. Pat. No. 6,075,650 describes a design for a single lens that can receive a diverging optical beam and circularize a cross section of it. The design includes parameters to compensate for misalignments between the source of the optical beam and the lens. In alternative embodiments, the lens can be designed to collimate the optical beam, cause it to converge, or cause it to diverge. No effect on an intensity profile of the cross section of the optical beam is disclosed.

However, in other documents, various methods are taught to modify an intensity profile of a cross section of an optical beam.

U.S. Pat. Nos. 5,610,733, 5,850,300, 6,025,938, and 6,075,627 all disclose beam homogenizers. The beam homogenizers are realized as a pattern of diffractive gratings such that portions of an incident optical beam, that emerge from the pattern of diffractive gratings, diffract and overlap with one another in a manner that equalizes an intensity profile of a cross section of the optical beam. The pattern of diffractive gratings can be formed using photolithographic, etching, electron-beam writing, or other techniques. Fourier Transform analysis can be used to determine the pattern of diffractive gratings. U.S. Pat. No. 6,075,627 superimposes its pattern of diffractive gratings on a lens pattern to form an integrated optical element. The lens pattern is used to focus or deflect portions of the incident optical beam that pass through it. However, no effect on changing the shape of the cross section of the optical beam is disclosed.

U.S. Pat. No. 6,069,739 teaches a method for making an intensity profile of a cross section of an optical beam more uniform by imparting time delays in portions of the cross section of the optical beam to reduce temporal coherence across the cross section. A two-dimensional array of fly's eye lenses is placed in the path of the optical beam. Each fly's eye lens acts on the portion of the optical beam that passes through it to disperse it. Different time delays are imparted into the various portions of the optical beam to reduce further the temporal coherence across the cross section. The time delays are realized by forming some of the fly's eye lenses to include, along an optical path, a second material that acts to change the speed of light in the portion of the optical beam that passes through it. Alternatively, each of the fly's eye lenses can be formed of an identical material and the time delays can be realized by using one or more prisms placed along the optical path before the array of fly's eye lenses. The various portions of the optical beam traverse distances of different lengths between the prism and their respective fly's eye lens, thus imparting different time delays.

None of these teachings disclose a single apparatus for use in both beam shaping and intensity profile modification. What is needed is an apparatus that can shape a cross section of an optical beam, and alter its intensity profile while minimizing a reduction in an overall intensity of the optical beam. Advantageously, such an apparatus should be inherently robust in design, insensitive to minor misalignments along the optical path, simple to manufacture, and inexpensive.

SUMMARY OF THE INVENTION

This invention relates to an apparatus for optical beam shaping and diffusing, a method for making the apparatus, and a method for using the apparatus. The apparatus comprises a crystalline material object shaped to fit within an optical train and with a pattern of surface texture along an optical path.

The inventor has observed the phenomenon that, due to physical properties inherent to crystalline materials, standard surface removal processes applied to a portion of a surface of an object made of a crystalline material will form a surface texture pattern at that portion of the surface of the object. The inventor has determined that the arrangement of this surface texture pattern depends upon: (1) the identity of the crystalline material and (2) the orientation of crystal lattice axes within the object with respect to the portion of the surface of the object where the pattern of surface texture was formed.

Standard surface removal processes include, but are not limited to, mechanical grinding, ablating, chemical etching, plasma etching, ion milling, and combinations thereof. It is also possible to refine the arrangement of the pattern of surface texture by coupling lithographic patterning methods with any of the standard surface removal processes.

The apparatus can be used to change one or more of: (1) a shape, (2) an orientation, (3) an aspect ratio, (4) an angular pupil distribution, and (5) an intensity profile of a cross section of an optical beam. The surface texture pattern could be arranged on the portion of the surface of the apparatus so that several of these effects are combined and simultaneously imparted to the cross section of the optical beam as it passes through the surface texture pattern. Alternatively, different embodiments of the apparatus can be placed in a series along the optical path such that each individual apparatus imparts its own effect to the cross section of the optical beam with combined effects realized as the optical beam passes through the series of different embodiments.

An expected application of the apparatus is use in the manufacture of integrated circuit chips. By placing the apparatus in the optical train before a reticle, the apparatus can be used to shape and to diffuse the optical beam in a manner that mitigates horizontal-vertical (H-V) bias and its detrimental effects. Alternatively, the apparatus can be used to homogenize substantially the intensity profile of the cross section of the optical beam.

Where the apparatus has a curve shaped, optical properties of the crystalline material can be exploited to form tunable embodiments.

In an embodiment, the apparatus can be cylindrically shaped so that the aspect ratio of the cross section of the optical beam can be changed by rotating the cylindrically shaped apparatus about its longitudinal axis.

In an alternative embodiment, the apparatus can be cylindrically shaped so that the orientation of the cross section of the optical beam can be changed by rotating the cylindrically shaped apparatus about its longitudinal axis.

In another embodiment, the apparatus can be spherically shaped so that the aspect ratio of the cross section of the optical beam can be changed by rotating the spherically shaped apparatus about an axis and the orientation of the cross section of the optical beam can be changed by rotating the spherically shaped apparatus about another axis.

In yet another embodiment, different embodiments of the apparatus can be placed in a series along an optical path such that each individual apparatus imparts its own effect to the cross section of the optical beam with combined effects realized as the optical beam passes through the series of different embodiments.

BRIEF DESCRIPTION OF THE DRAWINGS

The accompanying drawings, which are incorporated herein and form part of the specification, illustrate the present invention and, together with the description, further serve to explain the principles of the invention and to enable a person skilled in the pertinent art to make and use the invention.

Embodiments of the invention are described with reference to the figures where like reference numbers indicate identical or functionally similar elements. Also in the figures, the left most digit(s) (either the first digit or first two digits) of each reference number identify the figure in which the reference number is first used.

DETAILED DESCRIPTION OF THE INVENTION

Apparatus for Optical Beam Shaping and Diffusing

The present invention realizes an apparatus for optical beam shaping and diffusing by exploiting asymmetries of crystalline optical materials.

Figure 1:
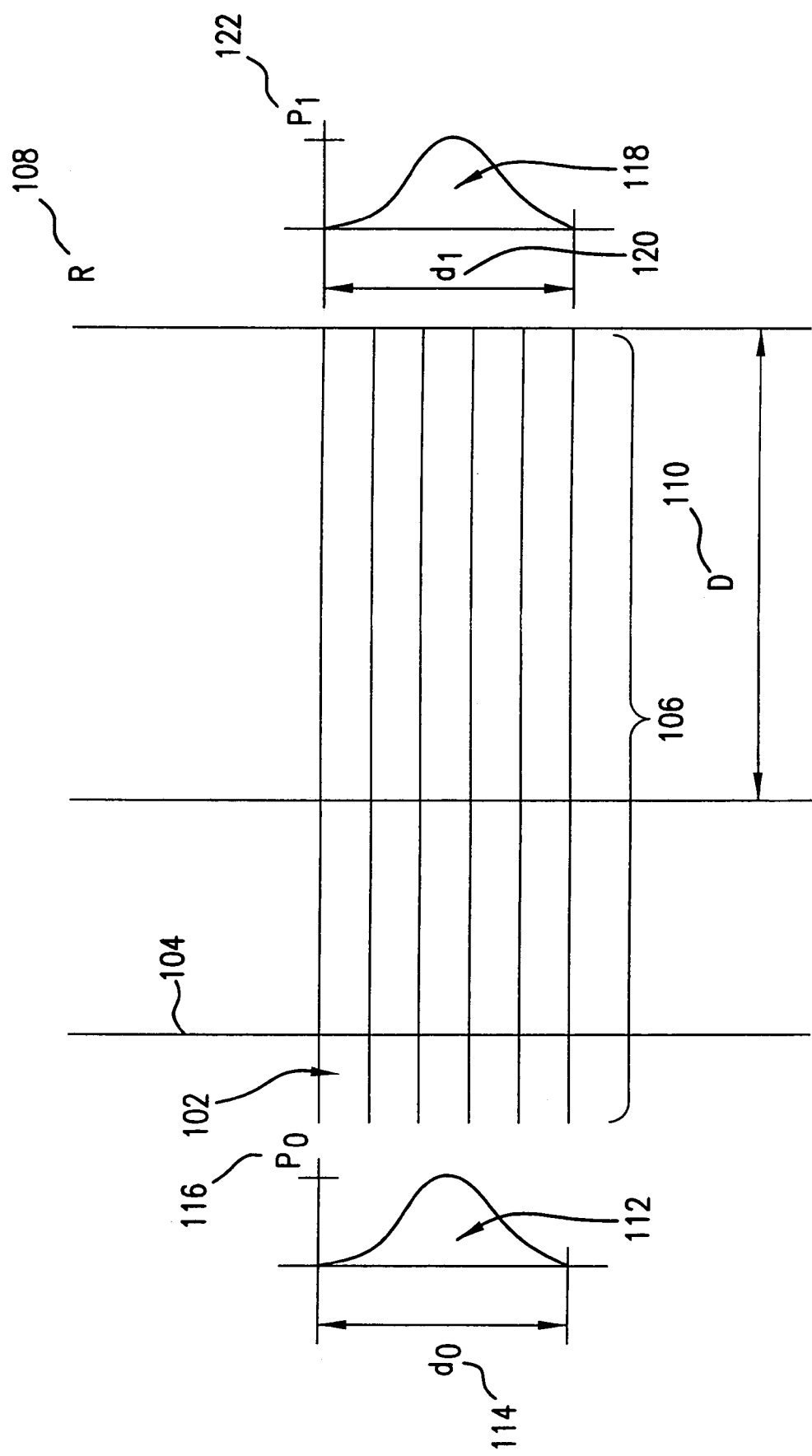
FIG. 1 shows a cross section of an optical beam 102 passing through a crystalline material object 104 along an optical path 106.

FIG. 1 shows a cross section of an optical beam 102 passing through a crystalline material object 104 along an optical path 106. The optical beam 102 impinges on a plane R 108 positioned a distance D 110 away from the crystalline material object 104. The optical beam 102 has an original intensity profile 112 distributed along a range $d_0$ 114. As shown in FIG. 1, the original intensity profile 112 of the optical beam 102 has a Gaussian shape with a peak value of $P_0$ 116. This is for illustrative purposes only and is not a limitation. The original intensity profile 112 can have any shape. Also shown in FIG. 1 is a destination intensity profile 118. In this example figure, the destination intensity profile 118 has a shape that matches the shape of the original intensity profile 112. The destination intensity profile 118 is distributed along a range $d_1$ 120 and has a peak value of $P_1$ 122. Notably, $d_1=d_0$ and $P_1=P_0$.

Figure 2:
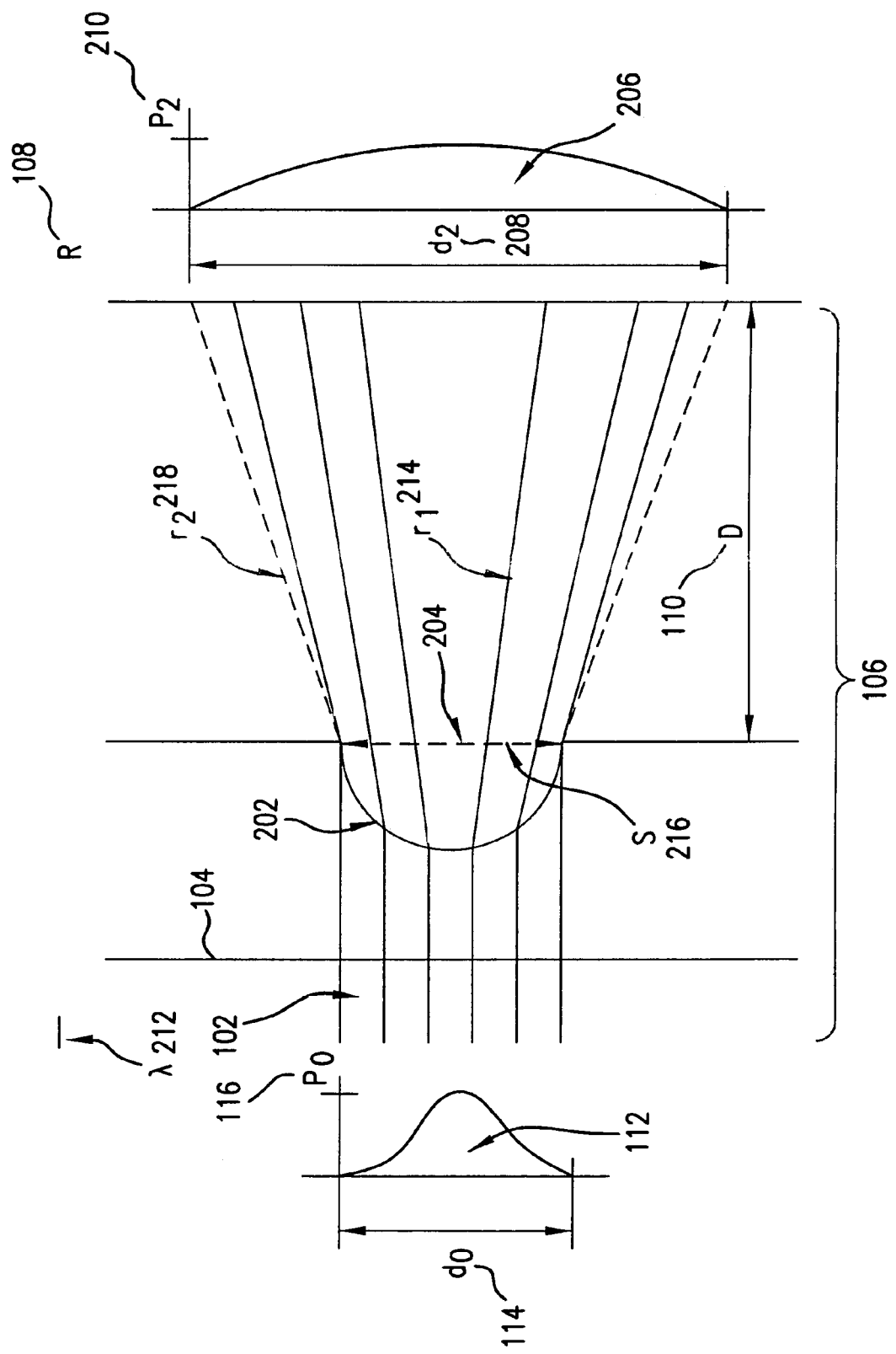
FIG. 2 shows the cross section of the optical beam 102 passing through the crystalline material object 104 with a surface texture element 202 along the optical path 106 in the manner of the present invention.

FIG. 2 shows the cross section of the optical beam 102 passing through the crystalline material object 104 with a surface texture element 202 along the optical path 106 in the manner of the present invention. In FIG. 2, the surface texture element 202 is shown as a recess in a portion of a surface 204 of the crystalline material object 104. This is for illustrative purposes only and is not a limitation. The surface texture element 202 could also be a rise or any other shape desired to support the application of the present invention. Also in FIG. 2, the portion of the surface 204 is shown to be along the optical path 106 at an exit location from the crystalline material object 104. Likewise, this is for illustrative purposes only and is not a limitation. The portion of the surface 204 could also be along the optical path 106 at an entrance location to the crystalline material object 104. The location of the portion of the surface 204 is a parameter to be considered by a designer in making the apparatus of the present invention. Thus, the location of the portion of the surface 204 is dependent upon the intended use of the apparatus.

In FIG. 2, the optical beam 102 impinges on the plane R 108 positioned the distance D 110 away from the crystalline material object 104. As in FIG. 1, the optical beam 102 has the original intensity profile 112 distributed along the range $d_0$ 114. The original intensity profile 112 of the optical beam 102 has the Gaussian shape with the peak value of $P_0$ 116. However, in FIG. 2, an effect of the surface texture element 202 on the optical beam 102 is to cause the optical beam 102 to diverge as it exits the crystalline material object 104. In turn, this divergence has an effect, on a destination intensity profile 206, of lengthening a range of distribution $d_2$ 208 while flattening a peak value $P_2$ 210. Here, $d_2>d_0$, while $P_2<P_0$. Thus, the destination intensity profile 208 is comparatively more homogenous than the original intensity profile 112. Also, the cross section of the optical beam 102 has a longer dimension at the plane R 108 than it has prior to entering the crystalline material object 104. Hence, the surface texture element 202 serves both to shape the cross section of the optical beam 104 and to alter its intensity profile. One skilled in the art will recognize that, where used in a photolithographic application, the ability to shape the cross section of the optical beam 104 and to alter its intensity profile can serve to mitigate H-V bias and its detrimental effects.

Typically, the surface texture element 202 has dimensions on an order of roughly ten times a wavelength ($\lambda$) 212 of the optical beam 102. With dimensions of such an order, both refractive and diffractive effects are discernably imparted into the optical beam 102 as it travels along the optical path 106 through the surface texture element 202. The refractive effect is a function of: (1) a difference in refractive indices between a medium of the crystalline material object 104 and a medium between the crystalline material object 104 and the plane R 108 and (2) an angle formed between a ray of the optical beam 104 and a line tangent to the surface texture element 202 at the point of incidence of the ray. This effect is well known to those skilled in the art. Illustratively, it is shown in FIG. 2 for a ray $r_1$ 214. The diffractive effect is a function of: (1) the wavelength $\lambda$ 212 of the optical beam 102, and (2) a spacing s 216 of the surface texture element 202. This effect is also well known to those skilled in the art. Illustratively, it is shown in FIG. 2 for a ray $r_2$ 218.

Figure 3:
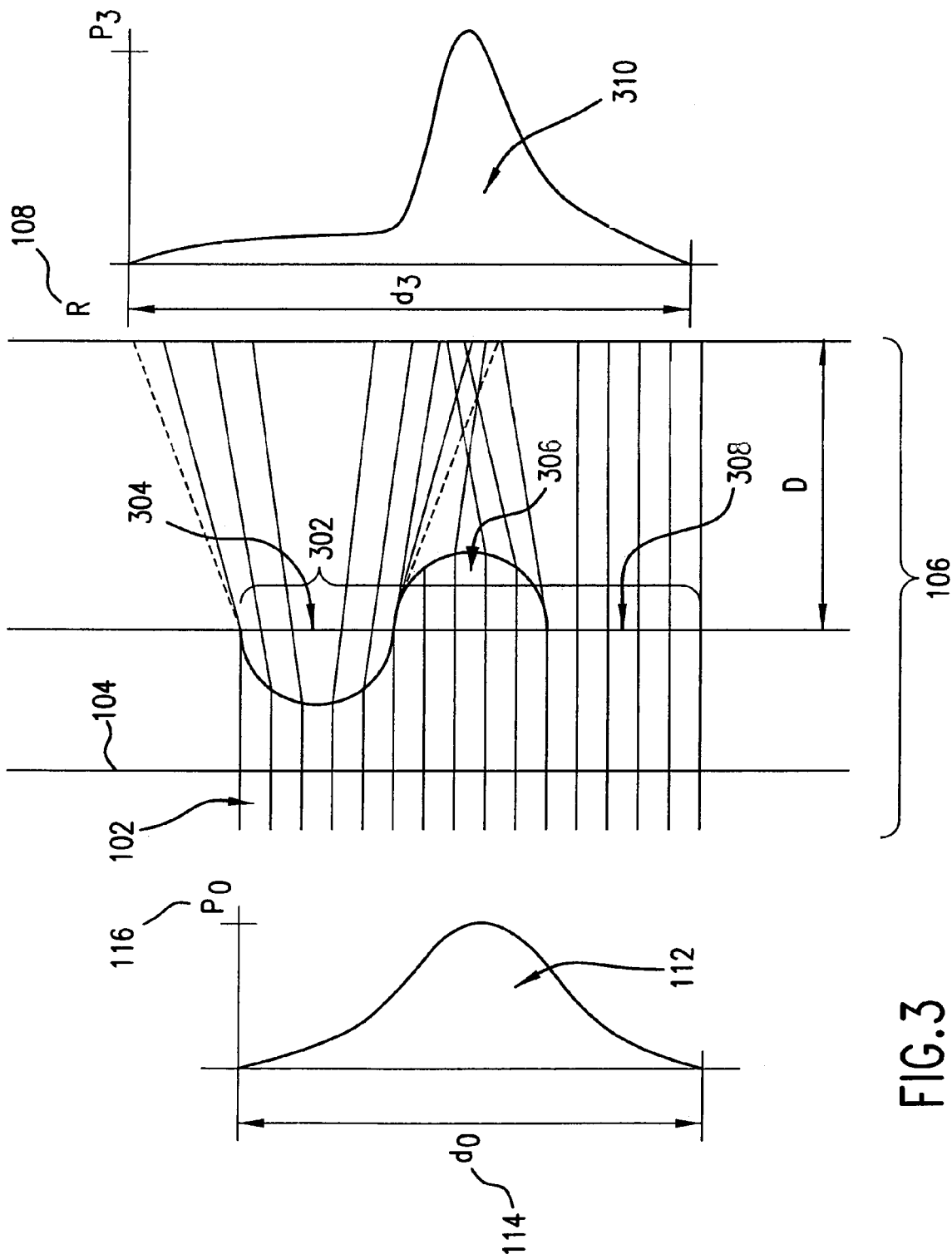
FIG. 3 shows the cross section of the optical beam 102 passing through the crystalline material object 104 with a pattern of surface texture 302 along the optical path 106 in the manner of the present invention.

FIG. 3 shows the cross section of the optical beam 102 passing through the crystalline material object 104 with a pattern of surface texture 302 along the optical path 106 in the manner of the present invention. The pattern of surface texture 302 includes a recess surface texture element 304, a rise surface texture element 306, and an unaltered surface element 308. As in FIG. 1, the optical beam 102 has the original intensity profile 112 distributed along the range $d_0$ 114. The original intensity profile 112 of the optical beam 102 has the Gaussian shape with the peak value of $P_0$ 116. However, in FIG. 3, an effect of the pattern of surface texture 302 on the optical beam 102 is to cause different portions of the optical beam 102 to diverge, to converge, or to pass directly through as they exit the crystalline material object 104. In whole, this effect causes a destination intensity profile 310 to have a specific shape.

One skilled in the art will recognize that with knowledge of: (1) the original intensity profile 112 and (2) a desired intensity profile, one could arrange the pattern of surface texture 302 so as to cause the optical beam 104 to have the desired intensity profile. Where such an analysis is conducted using Fourier Transforms, the transformed intensity profiles are referred to as angular pupil distributions. This technique is well known to those skilled in the art. Therefore, one could likewise use knowledge of: (1) an original angular pupil distribution and (2) a desired angular pupil distribution to arrange the pattern of surface texture 302, so as to cause the optical beam 104 to have the desired angular pupil distribution.

Figure 4A:
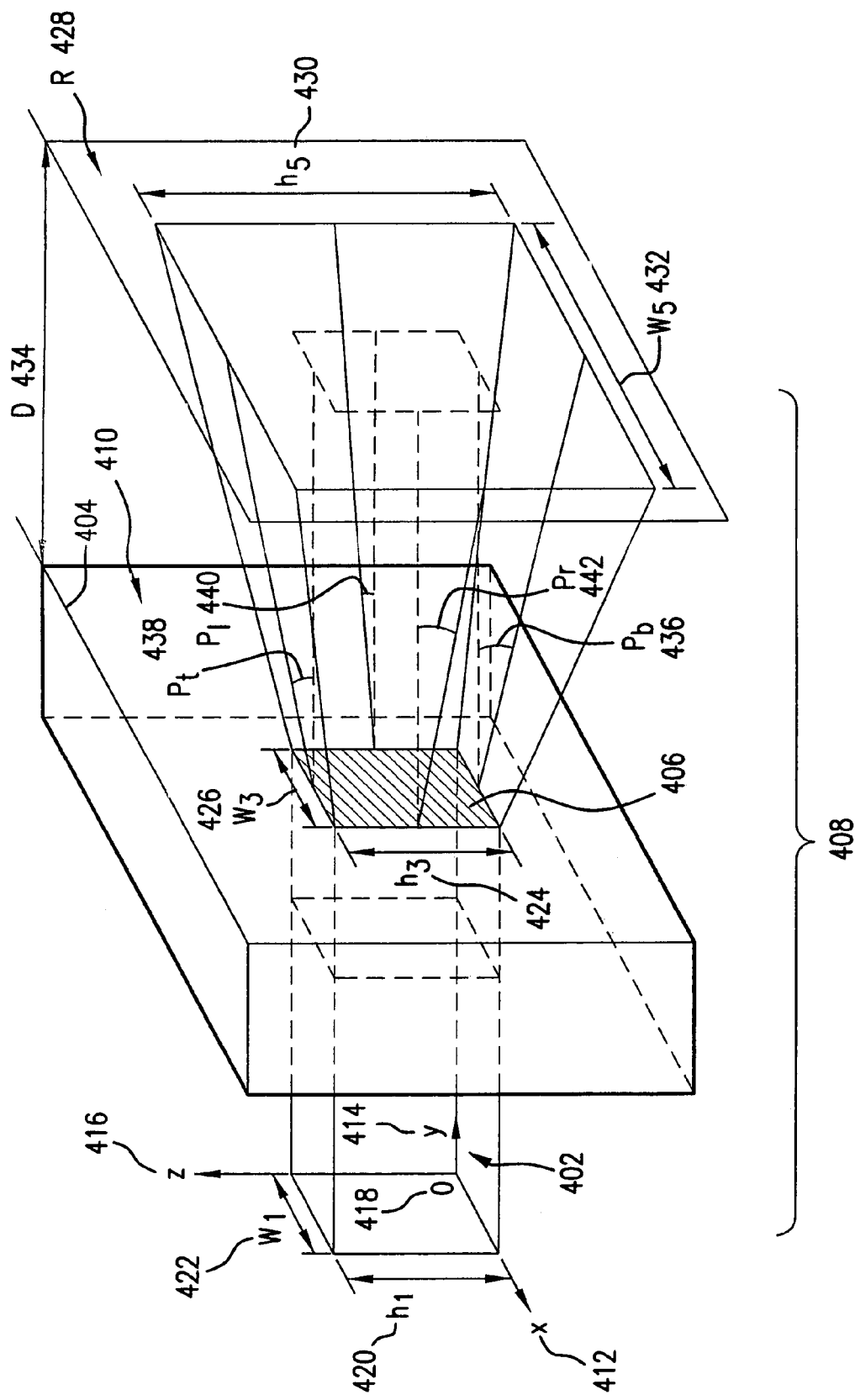
FIGS. 4A and 4B show an optical beam 402 passing through a crystalline material object 404 with a pattern of surface texture 406 along an optical path 408 to change an aspect ratio of a cross section of the optical beam 402 in the manner of the present invention.
Figure 4B:
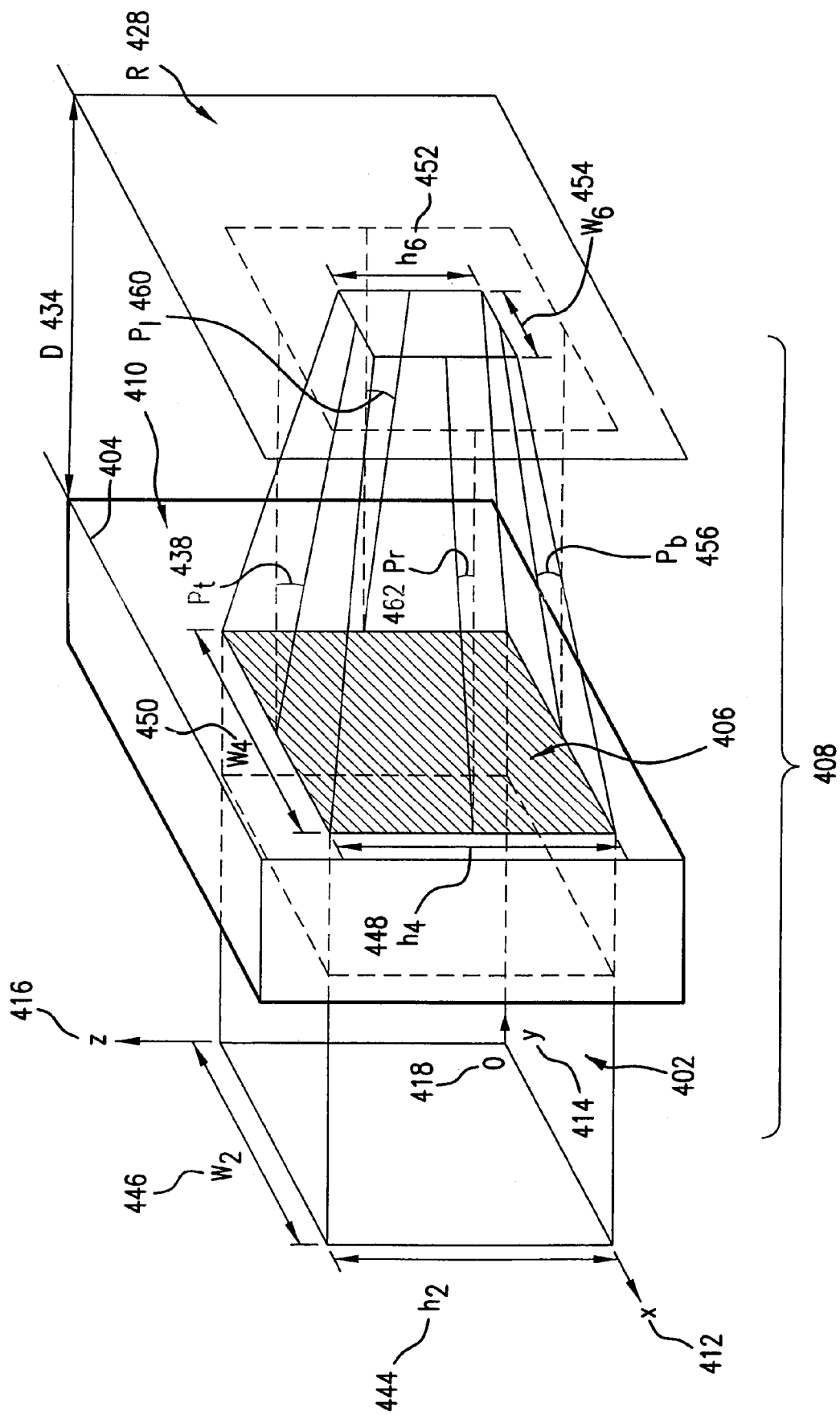
Figure 5:
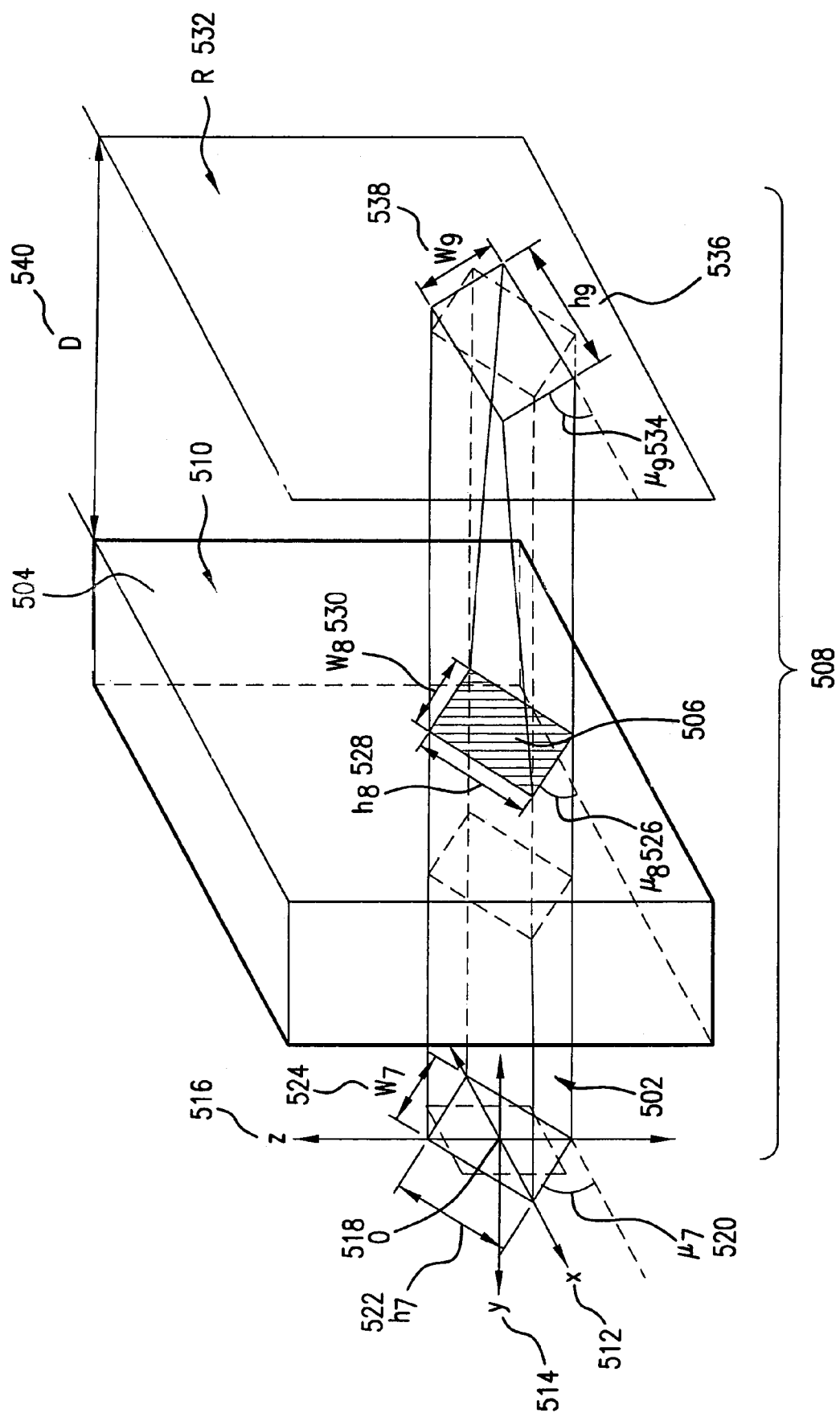
FIG. 5 show an optical beam 502 passing through a crystalline material object 504 with a pattern of surface texture 506 along an optical path 508 to change an orientation of a cross section of the optical beam 502 in the manner of the present invention.

FIGS. 2 and 3 show the effects of the present invention from cross sectional two-dimensional points of view. FIGS. 4A, 4B, and 5 show the effects of the present invention from three-dimensional points of view.

FIGS. 4A and 4B show an optical beam 402 passing through a crystalline material object 404 with a pattern of surface texture 406 along an optical path 408 to change an aspect ratio of a cross section of the optical beam 402 in the manner of the present invention. For illustrative purposes, the pattern of surface texture 406 is shown on an exit surface 410. Dimensions are shown with respect to an x-axis 412, a y-axis 414, and a z-axis 416. The axes intersect at a common point O 418 such that each axis forms a right angle with each other axis and no plane includes all three axes.

In FIG. 4A, the optical beam 402 travels along the y-axis 414. The cross section of the optical beam 402 has an original aspect ratio defined by a height $h_1$ 420 (with respect to a z-axis 416) and a width $w_1$ 422 (with respect to the x-axis 412). For illustrative purposes, $h_1 > w_1$.

The cross section of the optical beam 402 maintains its original dimensions as it passes through the crystalline material object 404 to the exit surface 410. Thus, at the exit surface 410, the cross section of the optical beam 402 has a height $h_3$ 424 (with respect to the z-axis 416) and a width $w_3$ 426 (with respect to the x-axis 412), such that $h_3 = h_1$ 1 and $w_3 = w_1$.

At a plane R 428, a desired aspect ratio is defined by a height $h_5$ 430 (with respect to a z-axis 416) and a width $w_5$ 432 (with respect to the x-axis 412). For illustrative purposes, $h_5 = w_5$. Hence, $h_5:w_5 \neq h_1:w_1$.

With knowledge of: (1) the original aspect ratio, (2) the desired aspect ratio, and (3) a distance D 434 between the crystalline material object 404 and the plane R 428, the pattern of surface texture 406 is arranged so that the optical beam 402 diverges to produce the desired aspect ratio at the plane R 428.

Upon exiting the crystalline material object 404, the optical beam 402 forms an angle of divergence $\rho_b$ 436 outward from a plane formed by the x-axis 412 and the y-axis 414. Likewise, an angle of divergence $\rho_t$ 438 is formed outward from a plane that intersects the z-axis 416 at the height $h_1$ 420 and is parallel to the plane formed by the x-axis 412 and the y-axis 414. Similarly, upon exiting the crystalline material object 404, the optical beam 402 forms an angle of divergence $\rho_l$ 440 outward from a plane formed by the y-axis 414 and the z-axis 416. Also, an angle of divergence $\rho_r$ 442 is formed outward from a plane that intersects the x-axis 412 at the width $w_1$ 422, and is parallel to the plane formed by the y-axis 414 and the z-axis 416. One skilled in the art will recognize that $\rho_b$ may or may not equal $\rho_t$, and that $\rho_l$ may or may not equal $\rho_r$. One skilled in the art will also recognize that, at the plane R 428, an aspect ratio of the cross section of the optical beam 402 can be further varied as a function of the distance D 434.

As mentioned, in FIG. 4A, $h_5 = w_5$. Therefore, the pattern of surface texture 406 has also caused the cross section of the optical beam 402 to change in shape from a rectangle to a square. (One skilled in the art will recognize that the pattern of surface texture 406 could also have been arranged to change the shape of the cross section of the optical beam 402 from an ellipse to a circle, or any other change in shape desired to support the application of the present invention in accordance with the teachings herein described.)

In FIG. 4B, the optical beam 402 travels along the y-axis 414. The cross section of the optical beam 402 has an original aspect ratio defined by a height $h_2$ 444 (with respect to a z-axis 416) and a width $w_2$ 446 (with respect to the x-axis 412). For illustrative purposes, $h_2 = w_2$.

The cross section of the optical beam 402 maintains its original dimensions as it passes through the crystalline material object 404 to the exit surface 410. Thus, at the exit surface 410, the cross section of the optical beam 402 has a height $h_4$ 448 (with respect to the z-axis 416) and a width $w_4$ 450 (with respect to the x-axis 412), such that $h_4 = h_2$ and $w_4 = w_2$.

At the plane R 428, a desired aspect ratio is defined by a height $h_6$ 452 (with respect to a z-axis 416) and a width $w_6$ 454 (with respect to the x-axis 412). For illustrative purposes, $h_6 > w_6$. Hence, $h_6:w_6 \neq h_2:w_2$.

With knowledge of: (1) the original aspect ratio, (2) the desired aspect ratio, and (3) the distance D 434 between the crystalline material object 404 and the plane R 428, the pattern of surface texture 406 is arranged so that the optical beam 402 converges to produce the desired aspect ratio at the plane R 428.

Upon exiting the crystalline material object 404, the optical beam 402 forms an angle of convergence $\rho_b$ 456 inward from the plane formed by the x-axis 412 and the y-axis 414. Likewise, an angle of convergence $\rho_t$ 458 is formed inward from the plane that intersects the z-axis 416 at the height $h_1$ 420 and is parallel to the plane formed by the x-axis 412 and the y-axis 414. Similarly, upon exiting the crystalline material object 404, the optical beam 402 forms an angle of convergence $\rho_l$ 460 inward from the plane formed by the y-axis 414 and the z-axis 416. Also, an angle of convergence $\rho_r$ 462 is formed inward from the plane that intersects the x-axis 412 at the width $w_1$ 422 and is parallel to the plane formed by the y-axis 414 and the z-axis 416. One skilled in the art will recognize that $\rho_b$ may or may not equal $\rho_t$ and that $\rho_l$ may or may not equal $\rho_r$. One skilled in the art will also recognize that, at the plane R 428, an aspect ratio of the cross section of the optical beam 402 can be further varied as a function of the distance D 434.

As mentioned, in FIG. 4B, $h_5 > w_5$. Therefore, the pattern of surface texture 406 has also caused the cross section of the optical beam 402 to change in shape from a square to a rectangle. (One skilled in the art will recognize that the pattern of surface texture 406 could also have been arranged to change the shape of the cross section of the optical beam 402 from a circle to an ellipse, or any other change in shape desired to support the application of the present invention in accordance with the teachings herein described.)

FIG. 5 shows an optical beam 502 passing through a crystalline material object 504 with a pattern of surface texture 506 along an optical path 508 to change an orientation of a cross section of the optical beam 502 in the manner of the present invention. For illustrative purposes, the pattern of surface texture 506 is shown on an exit surface 510. Dimensions are shown with respect to an x-axis 512, a y-axis 514, and a z-axis 516. The axes intersect at a common point O 518 such that each axis forms a right angle with each other axis and no plane includes all three axes.

In FIG. 5, the optical beam 502 travels along the y-axis 514. The cross section of the optical beam 502 has an original orientation at an angle $\mu_7$ 520 with respect to the x-axis 512. The cross section of the optical beam 502 also has an original aspect ratio defined by a height $h_7$ 522 and a width $w_7$ 524.

The cross section of the optical beam 502 maintains its original orientation and dimensions as it passes through the crystalline material object 504 to the exit surface 510. Thus, at the exit surface 510, the cross section of the optical beam 502 has an orientation at an angle $\mu_8$ 526 with respect to the x-axis 512, such that $\mu_8 = \mu_7$. Also at the exit surface 510, the cross section of the optical beam 502 has a height $h_8$ 528 and a width $w_8$ 530, such that $h_8 = h_7$ and $w_8 = w_7$.

At a plane R 532, a desired orientation is defined by an angle $\mu_9$ 534 with respect to the x-axis 512, such that $\mu_9 \neq \mu_7$. However, at the plane R 532, an aspect ratio is defined by a height $h_9$ 536 and a width $w_9$ 538, such that $h_9 > h_7$ and $w_9 > w_7$, but $h_9:w_9 = h_7:w_7$.

With knowledge of: (1) the original orientation, (2) the desired orientation, and (3) a distance D 540 between the crystalline material object 504 and the plane R 532, the pattern of surface texture 506 is arranged so that the optical beam 502 has the desired orientation at the plane R 532.

Because an aspect ratio of the cross section of the optical beam 502 at the plane R 532 equals the original aspect ratio, one skilled in the art will recognize that, at the plane 532, an orientation of the cross section of the optical beam 502 can be further varied as a function of the distance D 540.

However, because rays of the optical beam 502 diverge and converge upon exiting the crystalline material object 504, the value of the height $h_9$ and the value of the width $w_9$ will also vary as a function of the distance D 540.

One skilled in the art will recognize that, the pattern of surface texture 506 can be configured so that the value of the height $h_9$ and the value of the width $w_9$ remain constant (and equal, respectively, to the value of the height $h_7$ and the value of the width $w_7$) as the distance D 540 varies. In such an embodiment, an orientation of the cross section of the optical beam 502 can be varied as a function of the distance D 540 without changing the value of the height $h_9$ and the value of the width $w_9$.

Regarding the teachings described above with regard to FIGS. 2, 3, 4A, 4B, and 5, one skilled in the art will recognize that, while each of the figures shows only one or two effects that the present invention can impart to a cross section of an optical beam, a surface texture pattern could be arranged so that several of these effects are combined and simultaneously imparted to the cross section of the optical beam as it passes through the surface texture pattern. Alternatively, different embodiments of the apparatus of the present invention can be placed in a series along an optical path such that each individual apparatus imparts its own effect to the cross section of the optical beam with combined effects realized as the optical beam passes through the series of different embodiments.

Figure 6:
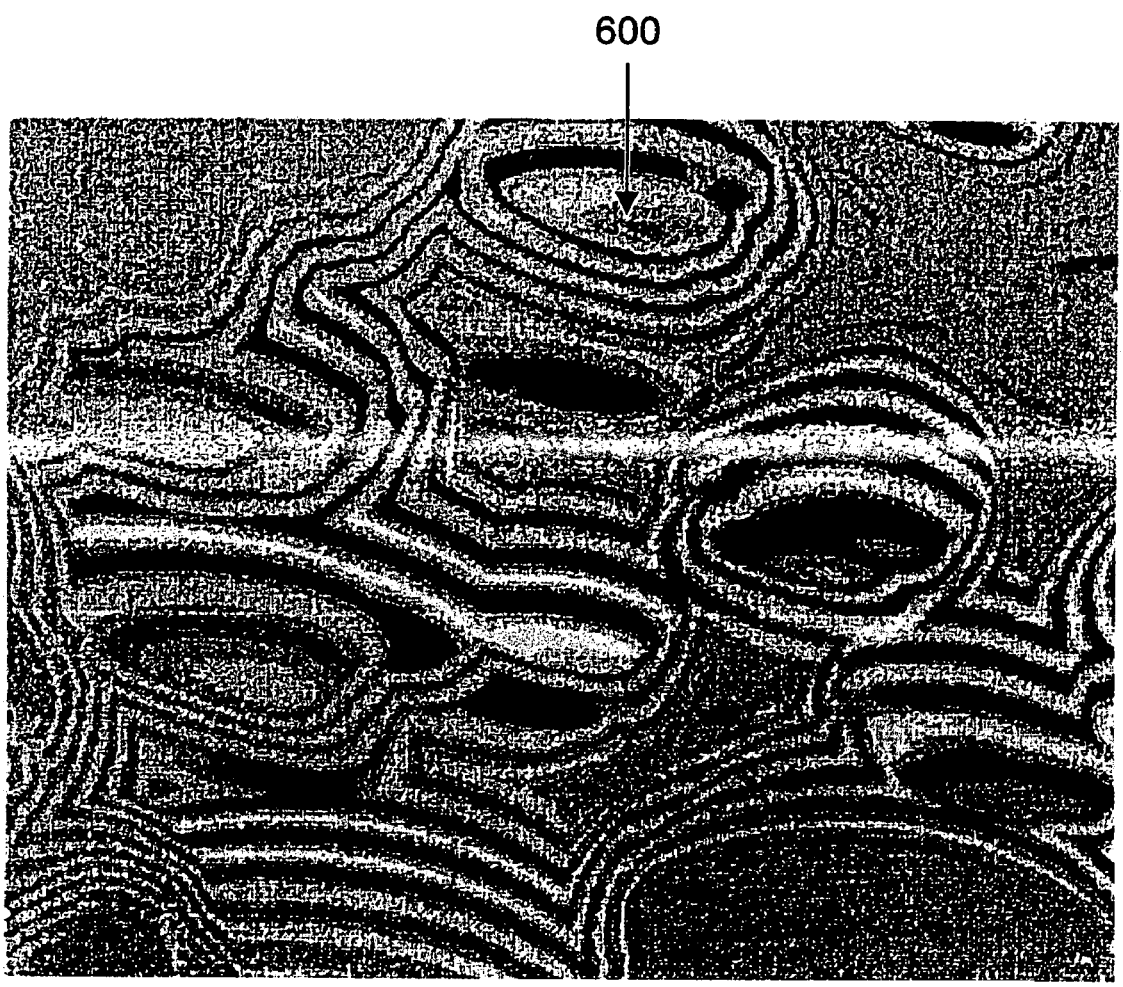
FIG. 6 is a photograph of a pattern of surface texture 600 that can be formed on a portion of a surface of a crystalline material object in the manner of the present invention.

FIG. 6 is a photograph of a pattern of surface texture 600 that can be formed on a portion of a surface of a crystalline material object in the manner of the present invention.

A key skill necessary to realize the apparatus of the present invention is an ability to form a desired pattern of surface texture on a surface of an object made of a crystalline material. The inventor has observed the phenomenon that, due to physical properties inherent to crystalline materials, standard surface removal processes applied to a portion of a surface of an object made of a crystalline material will form a surface texture pattern at that portion of the surface of the object. The inventor has determined that the arrangement of this surface texture pattern depends upon: (1) the identity of the crystalline material and (2) the orientation of crystal lattice axes within the object with respect to the portion of the surface of the object where the pattern of surface texture was formed.

Standard surface removal processes include, but are not limited to, mechanical grinding, ablating, chemical etching, plasma etching, ion milling, and combinations thereof. It is also possible to refine the arrangement of the pattern of surface texture by coupling lithographic patterning methods with any of the standard surface removal processes.

Figure 7:
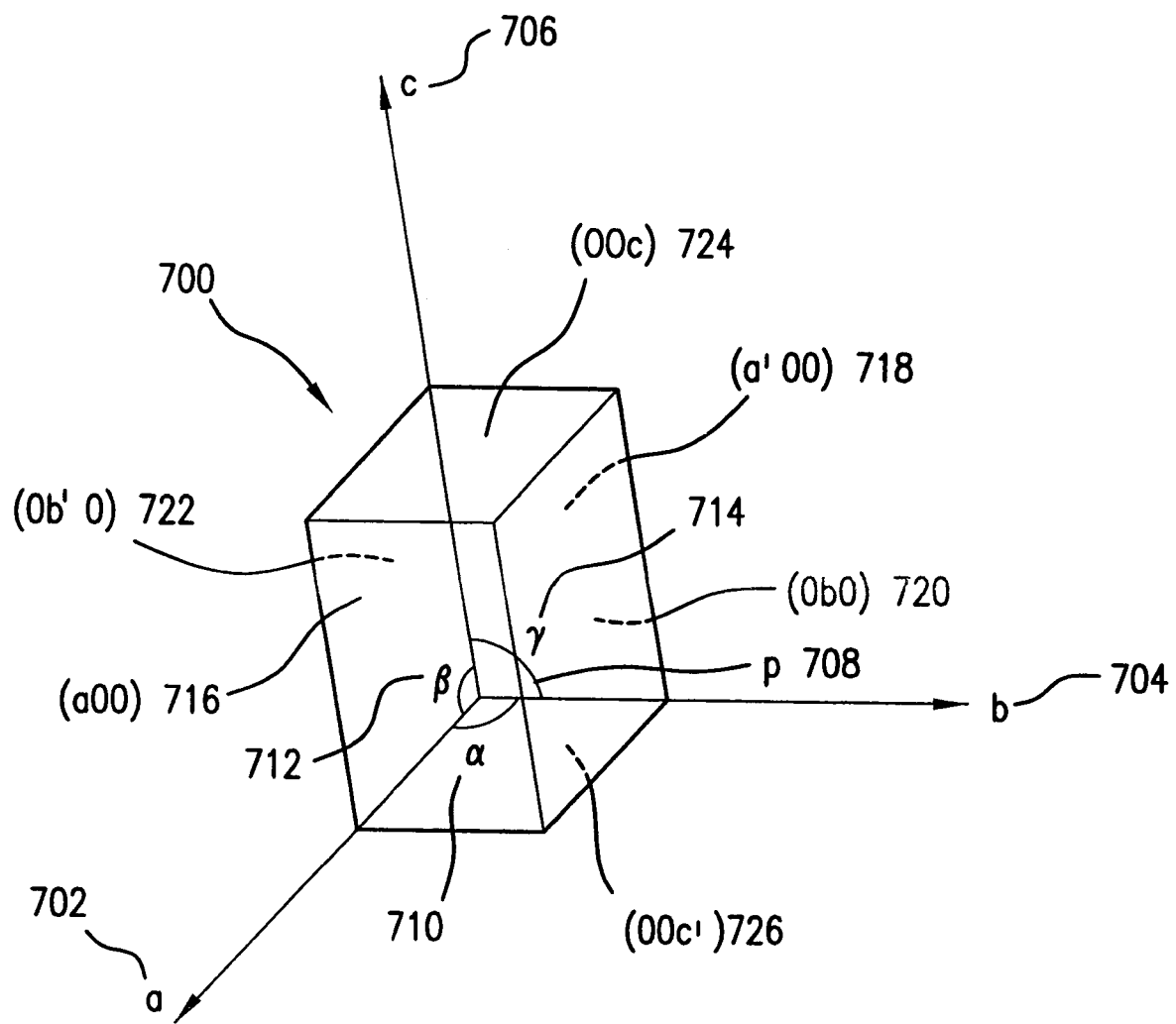
FIG. 7 represents a unit cell of a crystalline material 700.

FIG. 7 represents a unit cell of a crystalline material 700. The unit cell of the crystalline material 700 comprises a crystal lattice structure that resides on crystal lattice axes. By convention, these axes are labeled: a 702, b 704, and c 706. The axes intersect at a common point P 708. The axes define a three dimensional space so that no plane includes all three axes. The angle formed between axis a 702 and axis b 704 is labeled α 710; the angle formed between axis a 702 and axis c 706 is labeled β 712; and the angle formed between axis b 704 and axis c 706 is labeled _714. Each of these angles may or may not be at a right angle depending upon the classification of crystalline material 700.

Alternatively, where the unit cell of the crystalline material 700 is hexagonal, the crystal lattice structure is defined by four axes labeled: $a_1$, $a_2$, $a_3$, and c. For a hexagonal crystal, axes $a_1$, $a_2$, and $a_3$ all lie in a common plane such that each of these three axes forms a 120° angle with each other of these three axes. Axis c is perpendicular to this common plane. A hexagonal arrangement is not shown in a figure, but is well know to those skilled in the art.

Returning to FIG. 7, the unit cell of the crystalline material 700 also has six faces: (a00) 716, (a'00) 718, (0b0) 720, (0b'0) 722, (00c) 724, and (00c') 726.

Alternatively, where the unit cell of the crystalline material 700 is octohedronal, the unit cell of the crystalline material has eight faces. A octahedron arrangement is also not shown in a figure, but is likewise well known to those skilled in the art.

Figure 8:
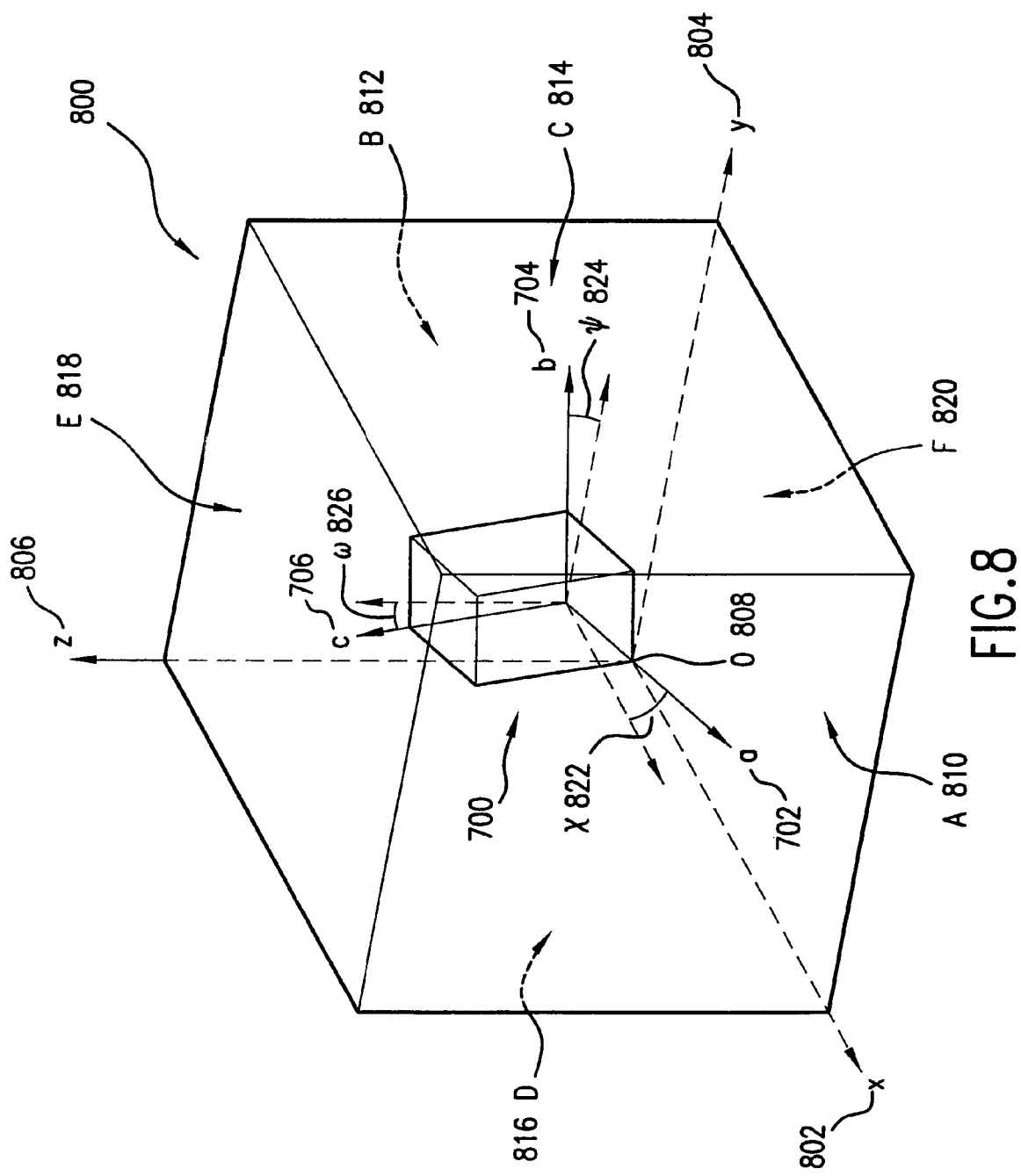
FIG. 8 represents an object 800 made of the crystalline material represented by the unit cell of the crystalline material 700.

FIG. 8 represents an object 800 made of the crystalline material represented by the unit cell of the crystalline material 700. The cubic shape of the object 800 is for illustrative purposes only and is not a limitation. The object 800 can be, and indeed typically is, any shape desired to support the application of the present invention. The object 800 has a three dimensional shape defined by three object axes: x 802, y 804, and z 806. The axes intersect at a common point O 808 such that each axis forms a right angle with each other axis and no plane includes all three axes. For illustrative purposes, the object 800 in FIG. 8 has six faces: A 810, B 812, C 814, D 816, E 818, and F 820.

Importantly, within the object 800, the crystal lattice axes of the crystalline material represented by the (greatly magnified) unit cell of the crystalline material 700 can be oriented in any manner to support the application of the present invention. Thus, in FIG. 8 the angle between crystal lattice axis a 702 and object axis x 802 is χ 822; the angle between crystal lattice axis b 704 and object axis y 804 is ψ 824; and the angle between crystal lattice axis c 706 and object axis z 806 is ω 826.

Figure 9:
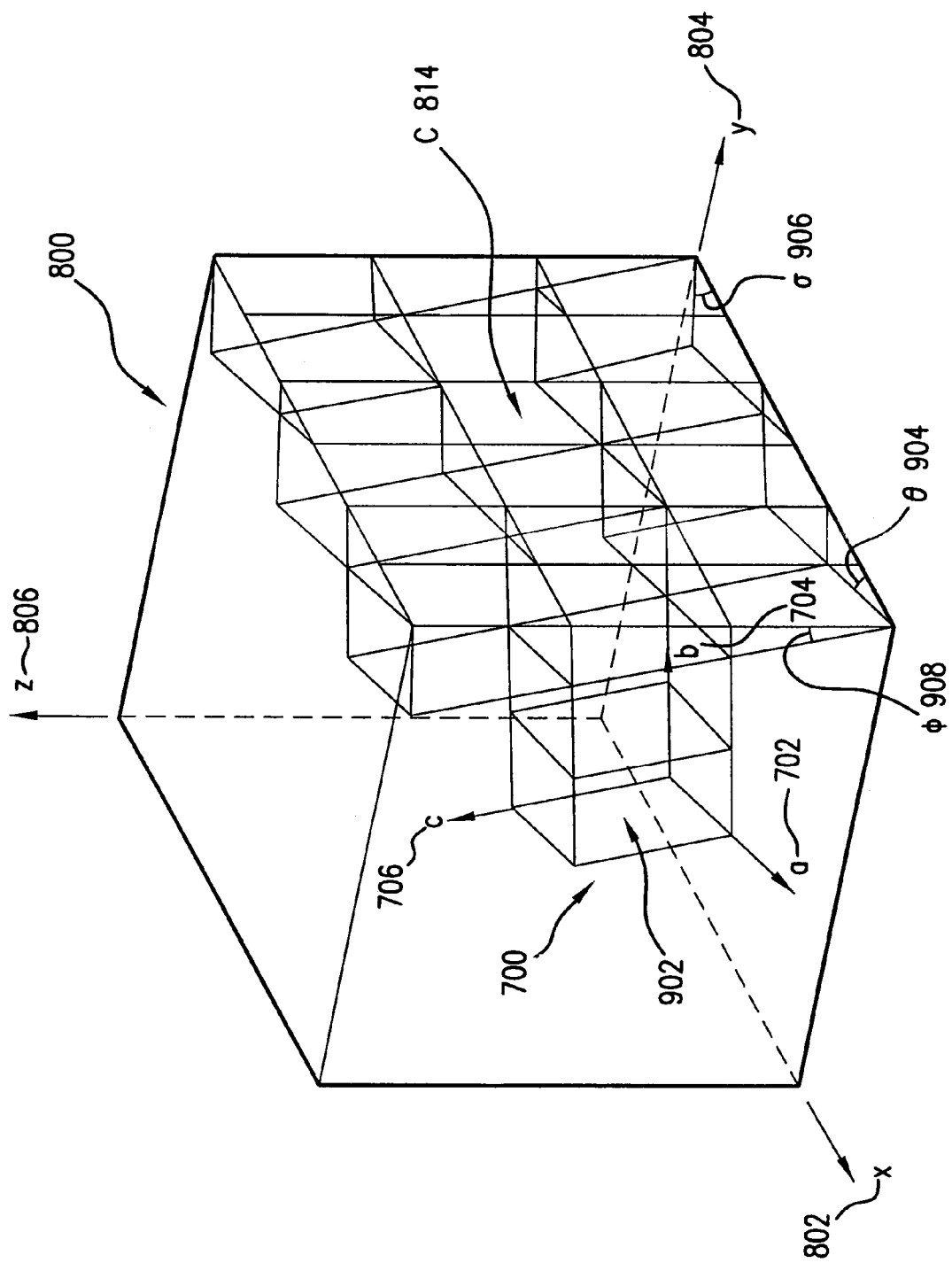
FIG. 9 shows the orientation of the crystal lattice axes in FIG. 8 in relation to a surface of the face C 814.

FIG. 9 shows the orientation of the crystal lattice axes in FIG. 8 in relation to a surface of the face C 814. A subobject 902 demonstrates a shape and an orientation of crystal lattice axes within the object 800. Labels for crystal lattice axes a 702, b 704, and c 706 as they are oriented in the object 800 are shown on the subobject 902. Illustratively, the subobject 902 consists, for example, of one million crystal unit cells arranged in a 100×100×100 pattern along each of the crystal lattice axes. As the orientation of the subobject 902 is repeated within the object 800, some other subobjects intersect the surface of the face C 814.

While at an atomic scale of crystal unit cells no crystal unit cell is partitioned, at the scale of the subobjects, those subobjects that intersect with the surface of the face C 814 are shown to be partitioned at various angles with respect to the surface of the face C 814. These are: between the surface of the face C 814 and the a-axis 702, an angle θ 904; between the surface of the face C 814 and the b-axis 704, an angle σ 906; and between the surface of the face C and the c-axis 706, an angle φ 908.

Where a standard surface removal process is applied to a portion of the surface of the face C 814, an arrangement of a surface texture pattern formed is a function of: (1) the identity of the crystalline material of the unit cell of the crystalline material 700, and (2) the values of the angle θ 904, the angle σ 906, and the angle φ 908.

Figure 10:
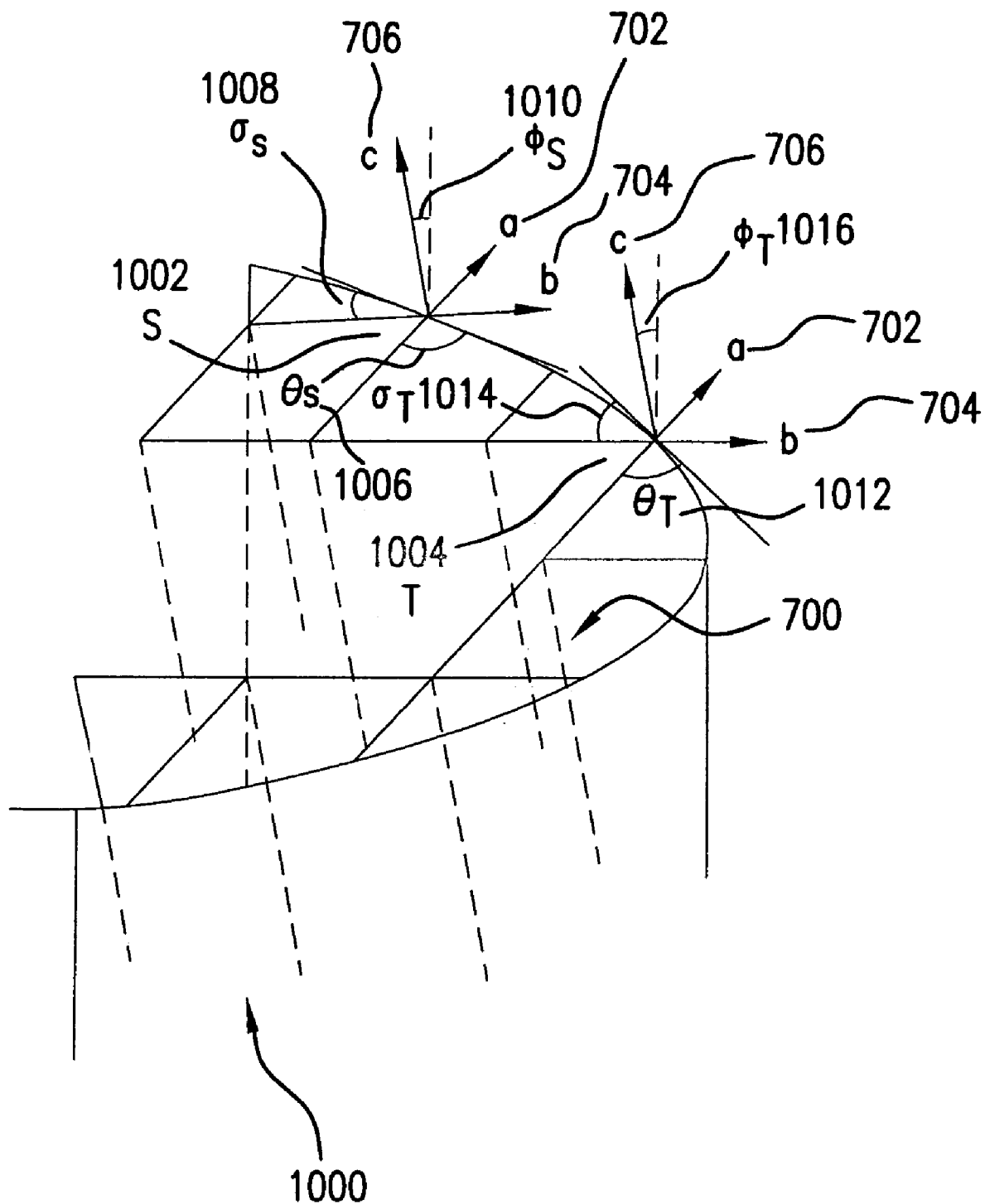
FIG. 10 represents a curved object 1000 made of the crystalline material represented by the unit cell of the crystalline material 700.

FIG. 10 represents a curved object 1000 made of the crystalline material represented by the unit cell of the crystalline material 700. Along a surface of the curved object 1000, a point S 1002 and a point T 1004 are shown. At the point S 1002, an angle $θ_S$ 1006 is formed between the surface of the curved object 1000 and the a-axis 702; an angle $σ_S$ 1008 is formed between the surface of the curved object 1000 and the b-axis 704; and an angle $φ_S$ 1010 is formed between the surface of the curved object 1000 and the c-axis 706. At the point T 1004, an angle $θ_T$ 1012 is formed between the surface of the curved object 1000 and the a-axis 702; an angle $σ_T$ 1014 is formed between the surface of the curved object 1000 and the b-axis 704; and an angle $φ_T$ 1016 is formed between the surface of the curved object 1000 and the c-axis 706.

The effect of the curvature of the surface of the curved object 1000 is that the angle $θ_S$ 1006 likely does not equal the angle $θ_T$ 1012, the angle as 1008 likely does not equal the angle $σ_T$ 1014, and the angle $φ_S$ 1010 likely does not equal the angle $φ_T$ 1016. Hence, an arrangement of a surface texture pattern formed at the point S 1002 would likely be different from the arrangement of the surface texture pattern formed at the point T 1004. One skilled in the art will recognize that, by extending the teachings of FIG. 10, the curved object 1000 could have a cylindrical shape, a spherical shape, or any shape desired to support the application of the present invention.

A curve shaped object also opens up an opportunity to exploit optical properties of a crystalline material to form tunable embodiments of the present invention. Specifically, where an optical beam is passed through a crystalline material, it is possible to change an aspect ratio of a cross section of the optical beam by rotating the crystalline material about an axis of its crystal lattice. Similarly, it is possible to change an orientation of a cross section of the optical beam by rotating the crystalline material about another axis of its crystal lattice. These effects are well known to those skilled in the art.

Figure 11A:
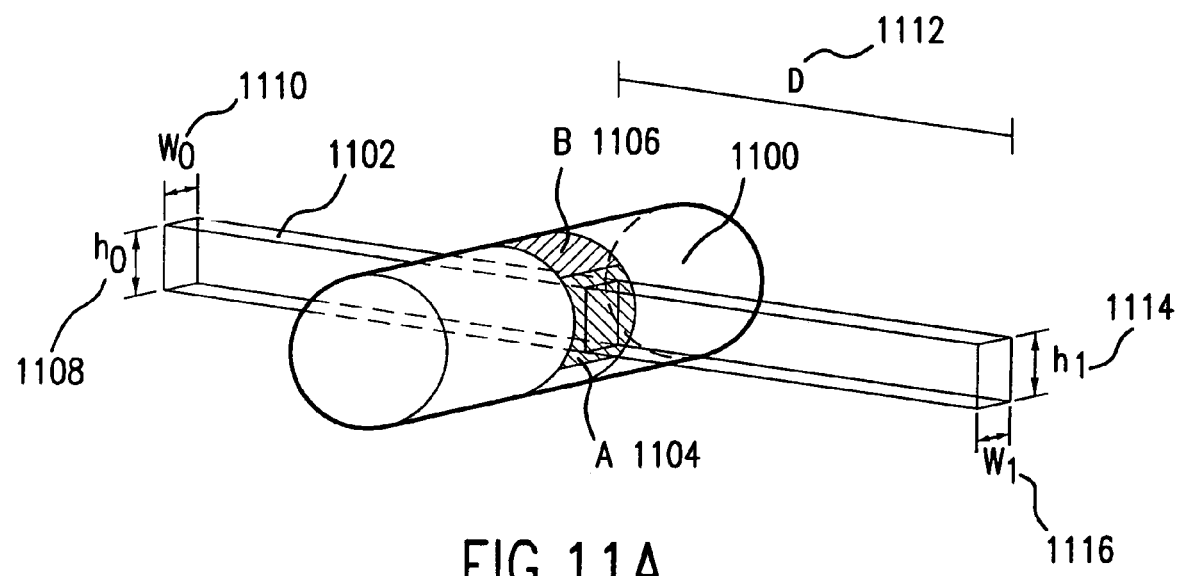
FIGS. 11A and 11B show a cylindrically shaped apparatus 1100 in the manner of the present invention in which an aspect ratio of a cross section of an optical beam 1102 can be changed by rotating the cylindrically shaped apparatus 1100 about its longitudinal axis.
Figure 11B:
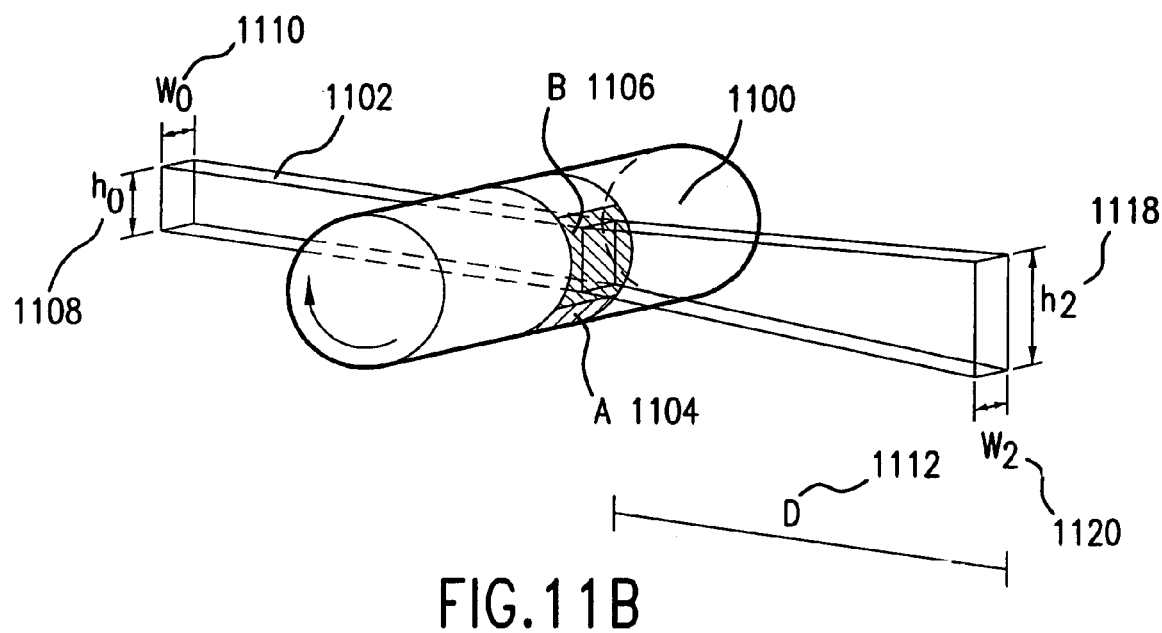

FIGS. 11A and 11B show a cylindrically shaped apparatus 1100 in the manner of the present invention in which an aspect ratio of a cross section of an optical beam 1102 can be changed by rotating the cylindrically shaped apparatus 1100 about its longitudinal axis. The longitudinal axis of cylindrically shaped apparatus 1100 corresponds to an appropriate axis of a crystal lattice that supports this effect. FIGS. 11A and 11B include, on a portion of a cylindrical surface of the cylindrically shaped apparatus 1100, a surface texture pattern A 1104 and a surface texture pattern B 1106.

In FIG. 11A, the optical beam 1102 passes through the surface texture pattern A 1104. The cross section of the optical beam 1102 has an original aspect ratio with a height $h_0$ 1108 and a width $w_0$ 1110. The optical beam 1102 passes directly through the surface texture pattern A 1104. Thus, at a distance D 1112 away from the cylindrically shaped apparatus 1100, the optical beam 1102 maintains the original aspect ratio with a height $h_1$ 1114 and a width $w_1$ 1116, such that $h_0=h_1$ and $w_0=w_1$.

FIG. 11B shows the same cylindrically shaped apparatus 1100 as in FIG. 11A, but rotated about its longitudinal axis so that the optical beam 1102 passes through the surface texture pattern B 1106.

In FIG. 11B, the optical beam 1102 passes through the surface texture pattern B 1106. The cross section of the optical beam 1102 has the original aspect ratio with the height $h_0$ 1108 and the width $w_0$ 1110. However, the optical beam 1102 diverges in height as it passes through the surface texture pattern B 1106. Thus, at distance D 1112 away from the cylindrically shaped apparatus 1100, the optical beam 1102 has an aspect ratio with a height $h_2$ 1118 and a width $w_2$ 1120, such that $h_2 > h_0$ and $w_2 = w_0$. Thus, the aspect ratio of the cross section of the optical beam is changed while the orientation of the cross section of the optical beam is maintained.

One skilled in the art will recognize that the surface texture pattern A 1104 and the surface texture pattern B 1106 could be merged into a single surface texture pattern such that the aspect ratio of the cross section of the optical beam can be changed on a continual basis as the cylindrically shaped apparatus 1100 is rotated about its longitudinal axis.

Figure 12A:
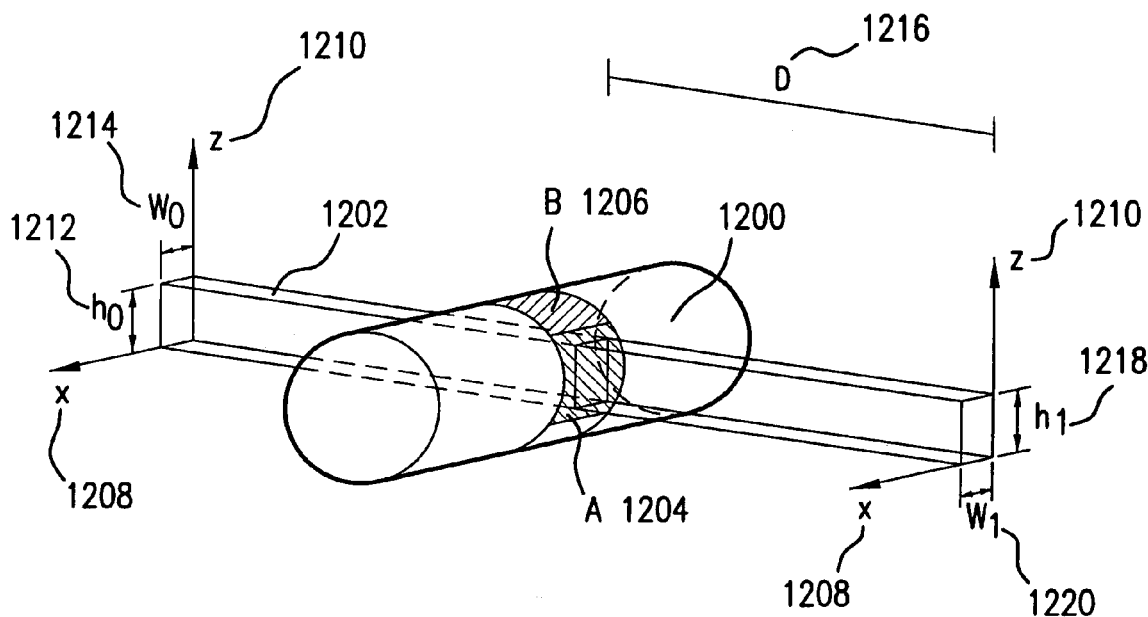
FIGS. 12A and 12B show a cylindrically shaped apparatus 1200 in the manner of the present invention in which an orientation of a cross section of an optical beam 1202 can be changed by rotating the cylindrically shaped apparatus 1200 about its longitudinal axis.
Figure 12B:
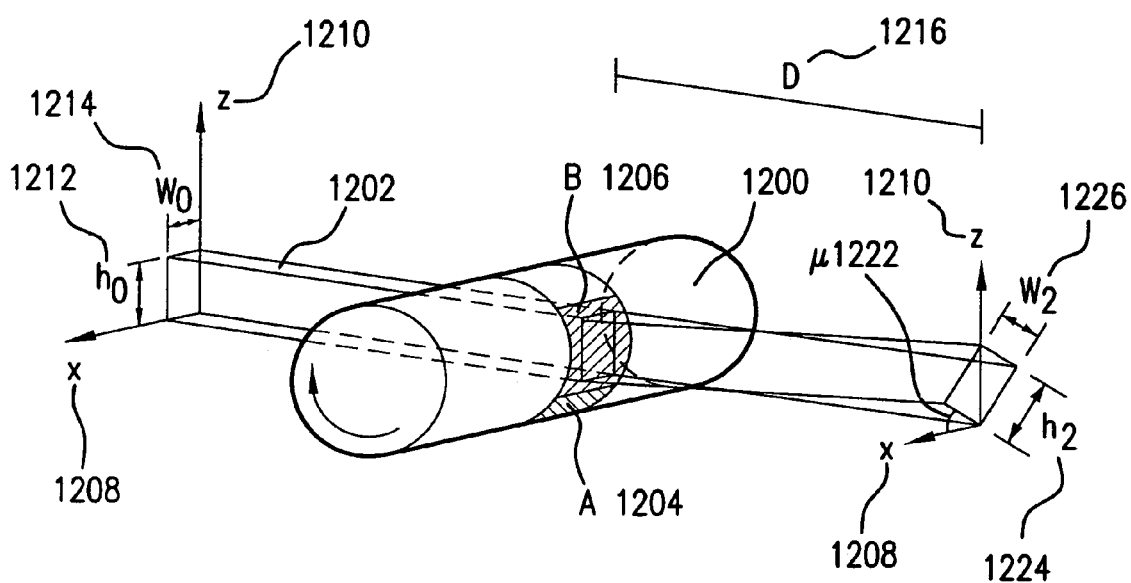

FIGS. 12A and 12B show a cylindrically shaped apparatus 1200 in the manner of the present invention in which an orientation of a cross section of an optical beam 1202 can be changed by rotating the cylindrically shaped apparatus 1200 about its longitudinal axis. The longitudinal axis of cylindrically shaped apparatus 1200 corresponds to an appropriate axis of a crystal lattice that supports this effect. FIGS. 12A and 12B include, on a portion of a cylindrical surface of the cylindrically shaped apparatus 1200, a surface texture pattern A 1204 and a surface texture pattern B 1206.

In FIG. 12A, the optical beam 1202 passes through the surface texture pattern A 1204. The cross section of the optical beam 1202 has an original orientation with respect to an x-axis 1208 and a y-axis 1210. The cross section of the optical beam 1202 also has an original shape defined by an original aspect ratio with a height ho 1212 and a width $w_0$ 1214. The optical beam 1202 passes directly through the surface texture pattern A 1204. Thus, at a distance D 1216 away from the cylindrically shaped apparatus 1200, the optical beam 1202 maintains the original orientation with respect to the x-axis 1208 and the y-axis 1210, and the original shape defined by an aspect ratio with a height $h_1$ 1218 and a width $w_1$ 1220, such that $h_0 = h_1$ and $w_0 = w_1$.

FIG. 12B shows the same cylindrically shaped apparatus 1200 as in FIG. 12A, but rotated about its longitudinal axis so that the optical beam 1202 passes through the surface texture pattern B 1206.

In FIG. 12B, the optical beam 1202 passes through the surface texture pattern B 1206. The cross section of the optical beam 1202, has the original orientation with respect to the x-axis 1208 and the y-axis 1210. The cross section of the optical beam 1202 also has the original shape defined by the original aspect ratio with the height $h_0$ 1212 and the width $w_0$ 1214. However, the optical beam rotates in orientation as it passes through the surface texture pattern B 1206. Thus, at distance D 1216 away from the cylindrically shaped apparatus 1200, the optical beam 1202 has an orientation at an angle μ 1222 with respect to the x-axis 1208, but maintains the original shape defined by an aspect ratio with a height $h_2$ 1224 and a width $w_2$ 1226, such that $h_2 = h_0$ and $w_2 = w_0$. Thus, the orientation of the cross section of the optical beam is changed while the aspect ratio of the cross section of the optical beam is maintained.

One skilled in the art will recognize that the surface texture pattern A 1204 and the surface texture pattern B 1206 could be merged into a single surface texture pattern such that the orientation of the cross section of the optical beam can be changed on a continual basis as the cylindrically shaped apparatus 1200 is rotated about its longitudinal axis.

One skilled in the art will also recognize that, by extending the teachings of FIGS. 11A, 11B, 12A, and 12B, a spherically shaped apparatus could be formed such that an aspect ratio of a cross section of an optical beam can be changed by rotating the spherically shaped apparatus about an axis and an orientation of the cross section of the optical beam can be changed by rotating the spherically shaped apparatus about another axis. Each axis corresponds to an appropriate axis of a crystal lattice that supports its respective effect.

Making the Apparatus for Optical Beam Shaping and Diffusing

Figure 13:
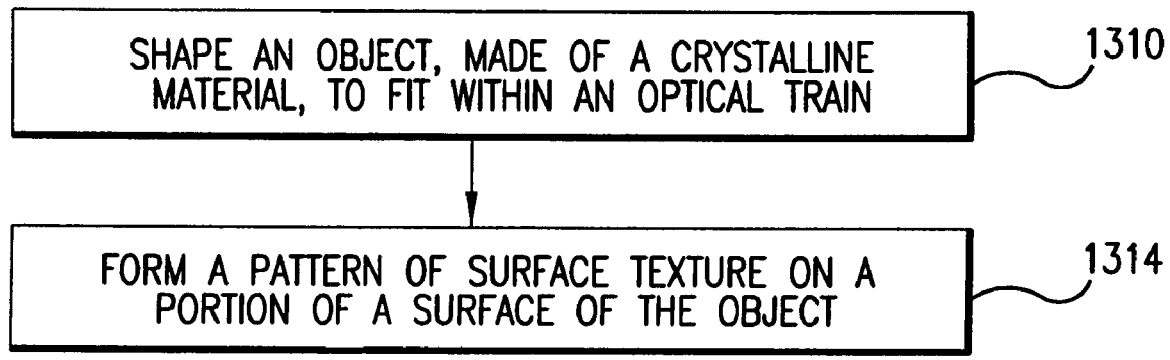
FIG. 13 shows a block diagram of a method of making an apparatus for optical beam shaping and diffusing in the manner of the present invention.

FIG. 13 shows a block diagram of a method of making an apparatus for optical beam shaping and diffusing in the manner of the present invention. In FIG. 13, at a step 1310, an object, made of a crystalline material, is shaped to fit within an optical train. At a step 1314, a pattern of surface texture is formed on a portion of a surface of the object, thereby making the apparatus for optical beam shaping and diffusing.

Figure 14:
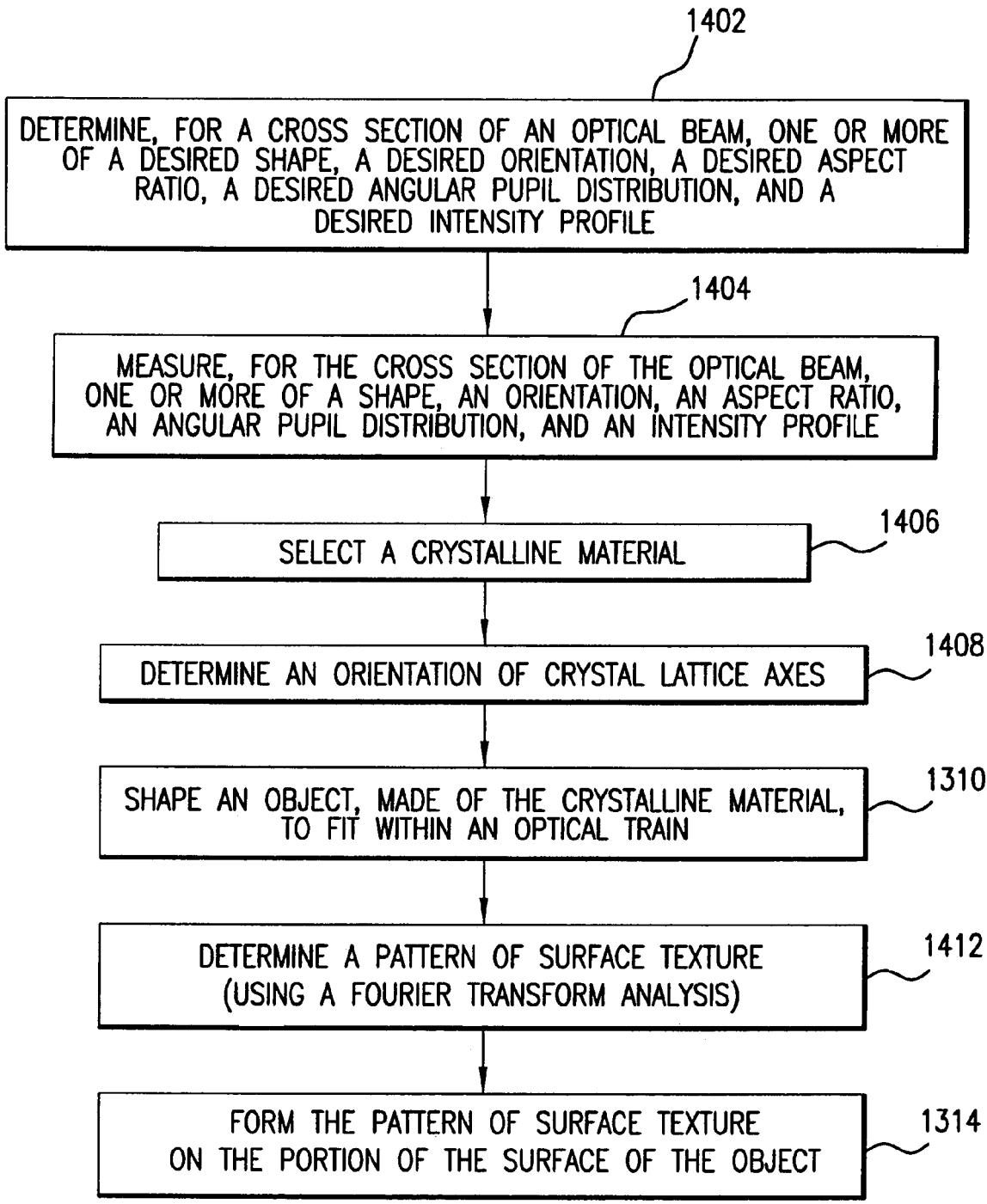
FIG. 14 shows a block diagram of the method of FIG. 13 with additional optional steps.

FIG. 14 shows a block diagram of the method of FIG. 13 with additional optional steps. In FIG. 14, optional steps 1402 through 1408 can precede step 1310 while an optional step 1412 can precede step 1314.

In FIG. 14, at optional step 1402, one or more of the following are determined for a cross section of an optical beam: (1) a desired shape, (2) a desired orientation, (3) a desired aspect ratio, (4) a desired angular pupil distribution, and (5) a desired intensity profile. Of the listed characteristics, the inclusion or exclusion of determinations of any of them will depend upon the intended application of the apparatus. This would be well known to one skilled in the art.

At optional step 1404, one or more of the following are measured for the cross section of the optical beam: (1) a shape, (2) an orientation, (3) an aspect ratio, (4) an angular pupil distribution, and (5) an intensity profile.

Likewise, of the listed characteristics, the inclusion or exclusion of measurements of any of them will depend upon the intended application of the apparatus. One skilled in the art will further recognize that knowledge of desired characteristics coupled with measurements of the same characteristics enables the skilled artisan to determine an appropriate arrangement of a pattern of surface texture to effect a transformation of the characteristics from their measured to their desired states. Optionally, Fourier Transform analysis can be used to determine the appropriate arrangement of the pattern of surface texture.

At optional step 1406, a crystalline material is selected. The crystalline material is selected based on physical properties that support modifying the crystalline material for the intended application of the apparatus. However, one skilled in the art will recognize other considerations that might also be addressed in selecting a crystalline material. Particularly, the ability to transmit an optical beam of a specific wavelength would be of paramount concern. Hence, other techniques for selecting a crystalline material would also be known to one skilled in the art.

At optional step 1408, an orientation of crystal lattice axes is determined. As with selection of the crystalline material, the orientation of the crystal lattice axes is based on physical properties that support modifying the crystalline material for the intended application of the apparatus. However, one skilled in the art will recognize other considerations that might also be addressed in determining the orientation of the crystal lattice axes. For example, where the intended application calls for a tunable apparatus in which an aspect ratio of the cross section of the optical beam or an orientation of the cross section of the optical beam can be changed by rotating the apparatus, optical properties of the crystalline material (related to the orientation of the crystal lattice axes) would also need to be considered in determining the orientation of the crystal lattice axes.

In FIG. 14, at step 1410, the object, made of the crystalline material, is shaped to fit within the optical train. Where it is desired that the apparatus have a substantially cylindrical shape such that the apparatus can be rotated about the longitudinal axis to change the orientation of the cross section of the optical beam while maintaining the aspect ratio of the cross section of the optical beam, the longitudinal axis of the object is made to coincide with an appropriate crystal lattice axis. Likewise, where it is desired that the apparatus have a substantially cylindrical shape such that the apparatus can be rotated about the longitudinal axis to change the aspect ratio of the cross section of the optical beam while maintaining the orientation of the cross section of the optical beam, the longitudinal axis of the object is again made to coincide with an appropriate crystal lattice axis. Also, where it is desired that the apparatus have a substantially spherical shape such that the apparatus can be rotated about an axis to change the orientation of the cross section of the optical beam and can be rotated about another axis to change the aspect ratio of the cross section of the optical beam, each axis corresponds to an appropriate axis of the crystal lattice that supports its respective effect.

In FIG. 14, at optional step 1412, a pattern of surface texture is determined. The pattern of surface texture can be determined through several techniques. Primarily, the inventor has observed the phenomenon that, due to physical properties inherent to crystalline materials, standard surface removal processes applied to a portion of a surface of an object made of a crystalline material will form a surface texture pattern at that portion of the surface of the object. The inventor has determined that the arrangement of this surface texture pattern depends upon, but is not limited to, the following: (1) the identity of the crystalline material and (2) the orientation of crystal lattice axes within the object with respect to the portion of the surface of the object where the pattern of surface texture is to be formed. However, one skilled in the art will recognize other techniques for determining the pattern of surface texture.

Furthermore, where knowledge of desired characteristics are coupled with measurements of the same characteristics, the skilled artisan can determine an appropriate arrangement of the pattern of surface texture to effect the transformation of the characteristics from their measured to their desired states. Optionally, Fourier Transform analysis can be used to determine the appropriate arrangement of the pattern of surface texture. Particularly, where it is desired that the surface texture pattern be arranged so that several effects can be,combined and simultaneously imparted to the cross section of the optical beam, the basic pattern of surface texture can be refined by applying lithographic masking techniques to the portion of the surface of the object and using further surface removal processes to refine the basic pattern of surface texture. Lithographic masking techniques include, but are not limited to, standard lithographic patterning, holographic patterning, digital diffractive patterning and combinations thereof.

An expected application of the apparatus of the present invention is use in the manufacture of integrated circuit chips. In this application, the apparatus can be employed to optimize anamorphic illumination and imaging effects such as non-circularly symmetric laser beam divergence. For example, the eximer lasers used in deep ultraviolet and far ultraviolet optical systems and laser diode systems often exhibit anamorphic beam profiles, which must be manipulated preferentially in the vertical verses horizontal axis.

Critical dimension control of horizontal linewidth verses vertical linewidth (H-V bias) in optical lithography can be controlled by varying the shape of the projection optic pupil (i.e., aperture) by selectively weighting the transmission through the pupil as a function of the two orientations. This can be accomplished by adding ellipticity to the shape of the pupil. In this fashion, axial design differences can be accommodated.

Additionally, in the presence of optical aberrations in the projection optic, this selective weighting can drive phase errors in the optical wavefront that can enhance or degrade the lithographic image quality. This image quality modification results from focus shifts and lateral image shifts at the image plane. Measurement of as-manufactured lithographic performance can be used as feedback to optimize the balance between orthogonal linewidths. This optimization can occur through variation of the crystal optical axis during fabrication.

In FIG. 14, at step 1314, the pattern of surface texture is formed on the portion of a surface of the object, thereby making the apparatus for optical beam shaping and diffusing. The pattern of surface texture is formed using standard surface removal processes. These include, but are not limited to, mechanical grinding, ablating, chemical etching, plasma etching, ion milling and combinations thereof. Forming the pattern of surface texture with these methods is described further below. The pattern of surface texture can be formed using standard surface removal processes singly or in iterations. Where standard surface removal processes are used in iterations, different processes can be employed for successive iterations. Such processing techniques are well known to one skilled in the art.

Figure 15:
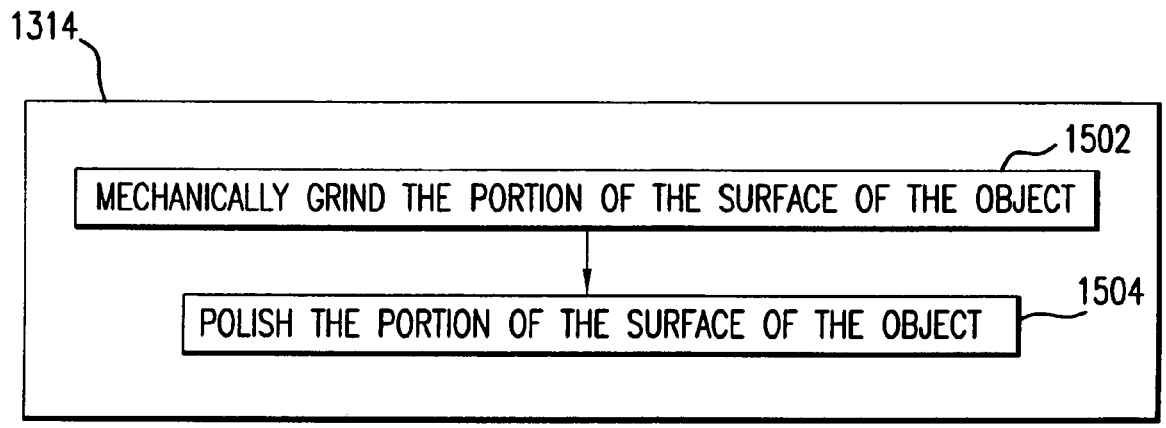
FIG. 15 shows a block diagram of forming the pattern of surface texture by mechanically grinding the portion of the surface of the object.

FIG. 15 shows a block diagram of forming the pattern of surface texture by mechanically grinding the portion of the surface of the object. Mechanical grinding is a standard surface removal process that can be used to realize step 1314. In FIG. 15, at a step 1502, the portion of the surface of the object is mechanically grinded. At a step 1504, the portion of the surface of the object is polished, thereby forming the pattern of surface texture on the portion of the surface of the object.

Figure 16:
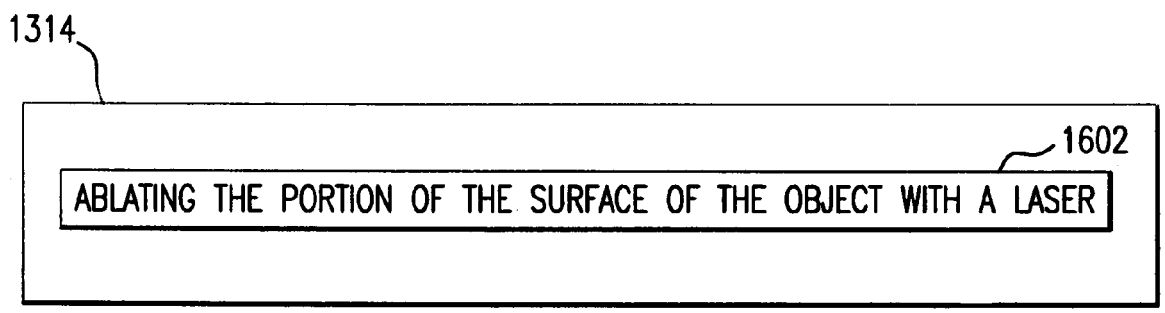
FIG. 16 shows a block diagram of forming the pattern of surface texture by ablating the portion of the surface of the object with a laser.

FIG. 16 shows a block diagram of forming the pattern of surface texture by ablating the portion of the surface of the object with a laser. Laser ablating is a standard surface removal process that can be used to realize step 1314. In FIG. 16, at a step 1602, the portion of the surface of the object is ablated with a laser, thereby forming the pattern of surface texture on the portion of the surface of the object.

Figure 17:
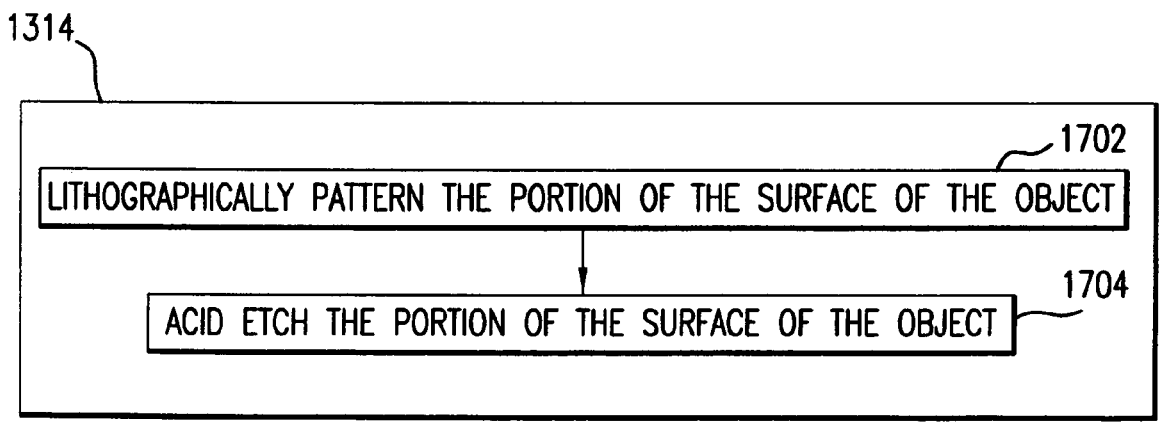
FIG. 17 shows a block diagram of forming the pattern of surface texture by chemical etching the portion of the surface of the object.

FIG. 17 shows a block diagram of forming the pattern of surface texture by chemical etching the portion of the surface of the object. Chemical etching is a standard surface removal process that can be used to realize step 1314. In FIG. 17, at an optional step 1702, the portion of the surface of the object can be lithographically patterned. This can be done to refine the pattern of surface texture to be formed on the portion of the surface of the object.

At a step 1704, the portion of the surface of the object is chemical etched, thereby forming the pattern of surface texture on the portion of the surface of the object.

Figure 18:
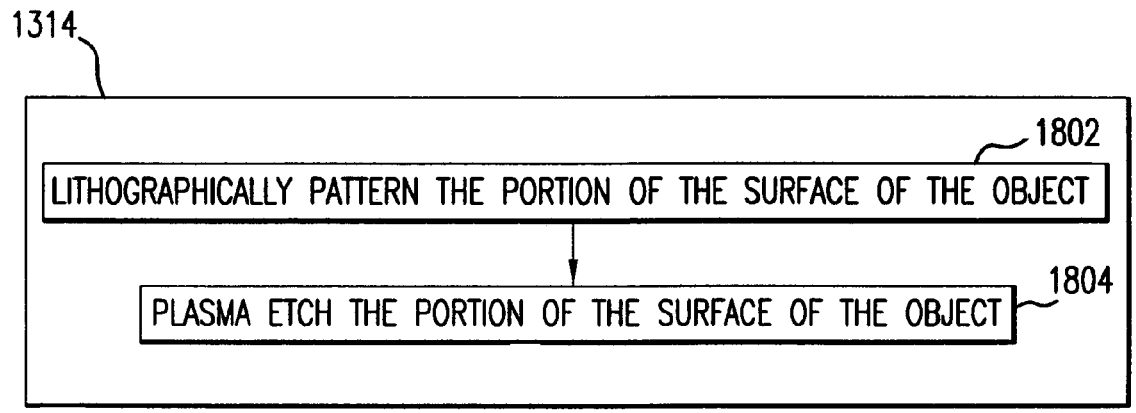
FIG. 18 shows a block diagram of forming the pattern of surface texture by plasma etching the portion of the surface of the object.

FIG. 18 shows a block diagram of forming the pattern of surface texture by plasma etching the portion of the surface of the object. Plasma etching is a standard surface removal process that can be used to realize step 1314. In FIG. 18, at an optional step 1802, the portion of the surface of the object can be lithographically patterned. This can be done to refine the pattern of surface texture to be formed on the portion of the surface of the object.

At a step 1804, the portion of the surface of the object is plasma etched, thereby forming the pattern of surface texture on the portion of the surface of the object.

Figure 19:
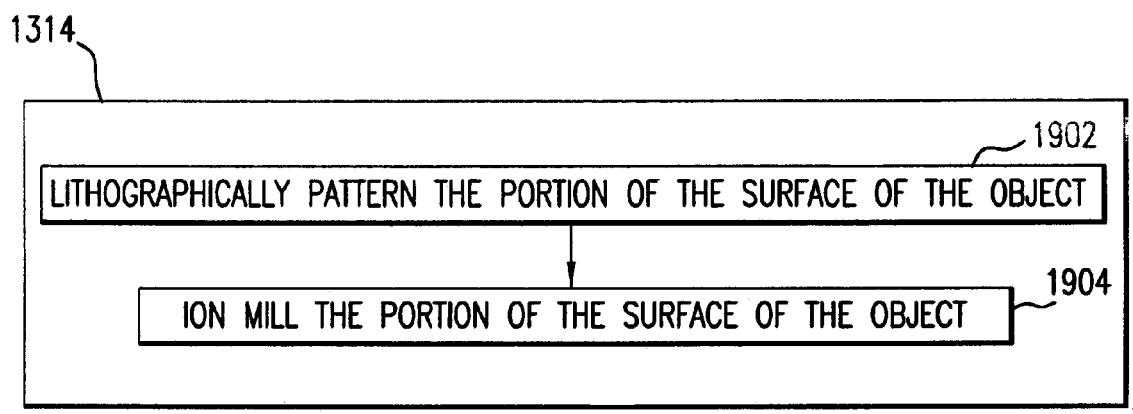
FIG. 19 shows a block diagram of forming the pattern of surface texture by ion milling the portion of the surface of the object.

FIG. 19 shows a block diagram of forming the pattern of surface texture by ion milling the portion of the surface of the object. Ion milling is a standard surface removal process that can be used to realize step 1314. In FIG. 19, at an optional step 1902, the portion of the surface of the object can be lithographically patterned. This can be done to refine the pattern of surface texture to be formed on the portion of the surface of the object.

At a step 1904, the portion of the surface of the object is ion milled, thereby forming the pattern of surface texture on the portion of the surface of the object.

Using the Apparatus for Optical Beam Shaping and Diffusing

Figure 20:
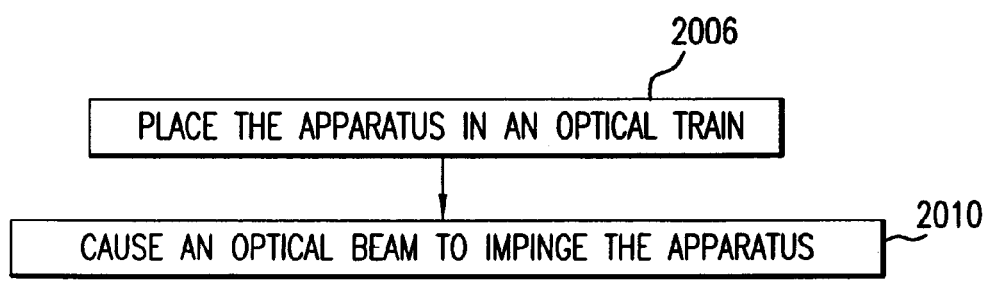
FIG. 20 shows a block diagram of a method of using an apparatus for optical beam shaping and diffusing in the manner of the present invention.

FIG. 20 shows a block diagram of a method of using an apparatus for optical beam shaping and diffusing in the manner of the present invention. In FIG. 20, at a step 2006, the apparatus is placed in an optical train. At a step 2010, the optical beam is made to impinge the apparatus, thereby shaping and diffusing the optical beam.

Figure 21:
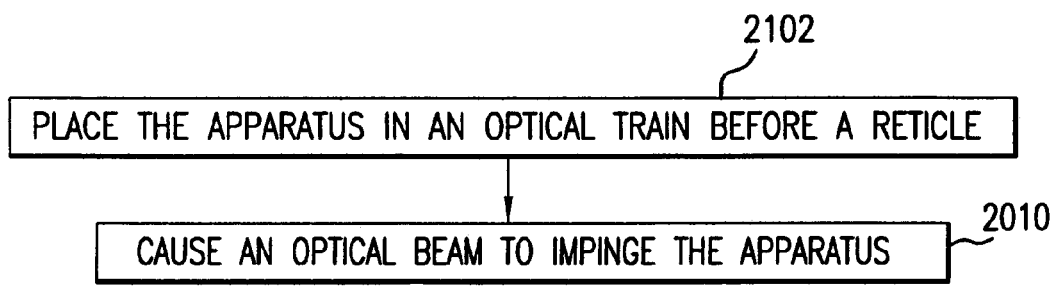
FIG. 21 shows a block diagram of a method of using the apparatus in an optical train with a reticle.

FIG. 21 shows a block diagram of a method of using the apparatus in an optical train with a reticle. An expected application of the apparatus of the present invention is use in the manufacture of integrated circuit chips. In this application, the apparatus can be employed to optimize anamorphic illumination and imaging effects such as non-circularly symmetric laser beam divergence. For example, the eximer lasers used in deep ultraviolet and far ultraviolet optical systems and laser diode systems often exhibit anamorphic beam profiles, which must be manipulated preferentially in the vertical verses horizontal axis.

Critical dimension control of horizontal linewidth verses vertical linewidth (H-V bias) in optical lithography can be controlled by varying the shape of the projection optic pupil (i.e., aperture) by selectively weighting the transmission through the pupil as a function of the two orientations. This can be accomplished by adding ellipticity to the shape of the pupil. In this fashion, axial design differences can be accommodated.

Additionally, in the presence of optical aberrations in the projection optic, this selective weighting can drive phase errors in the optical wavefront that can enhance or degrade the lithographic image quality. This image quality modification results from focus shifts and lateral image shifts at the image plane.

To realize this application, in FIG. 21, at a step 2102, the apparatus is placed in an optical train before a reticle. At step 2010, the optical beam is made to impinge the apparatus, thereby shaping and diffusing the optical beam in a manner to mitigate H-V bias and its detrimental effects.

Different embodiments of the apparatus of the present invention could be placed in a series along an optical path such that each individual apparatus imparts its own effect to the cross section of the optical beam with combined effects realized as the optical beam passes through the series of different embodiments.

Figure 22:
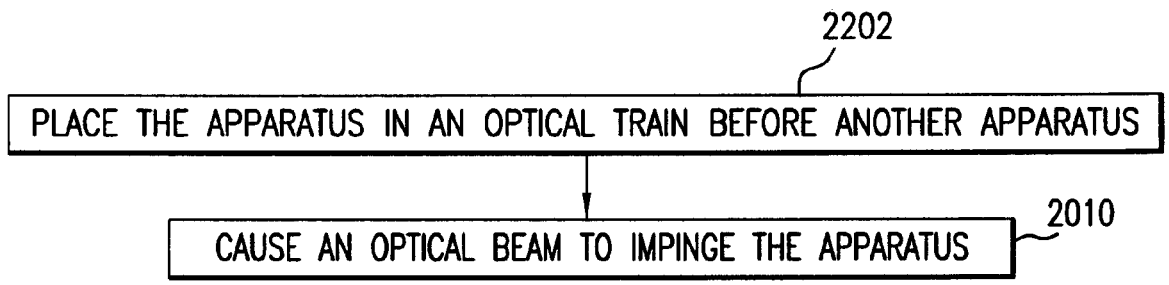
FIG. 22 shows a block diagram of a method of using the apparatus in an optical train before another apparatus.

Therefore, FIG. 22 shows a block diagram of a method of using the apparatus in an optical train before another apparatus. In FIG. 22, at a step 2202, the apparatus is placed in an optical train before another apparatus. At step 2010, the optical beam is made to impinge the apparatus, thereby imparting combined effects to the optical beam.

Figure 23:
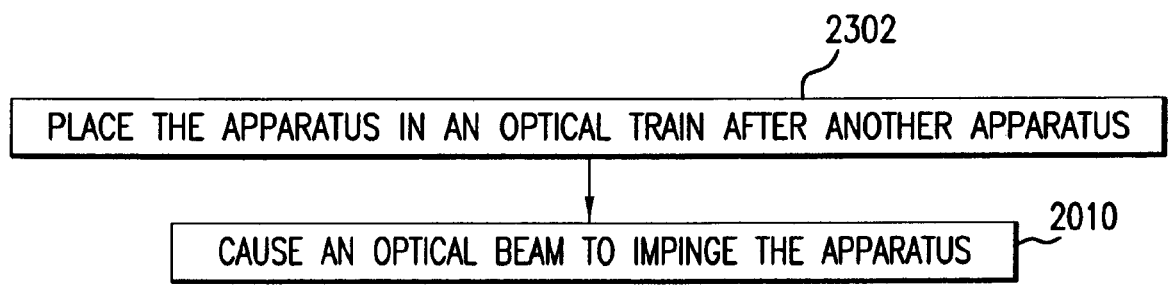
FIG. 23 shows a block diagram of a method of using the apparatus in an optical train after another apparatus.

Likewise, FIG. 23 shows a block diagram of a method of using the apparatus in an optical train after another apparatus. In FIG. 23, at a step 2302, the apparatus is placed in an optical train after another apparatus. At step 2010, the optical beam is made to impinge the apparatus, thereby imparting combined effects to the optical beam.

Figure 24:
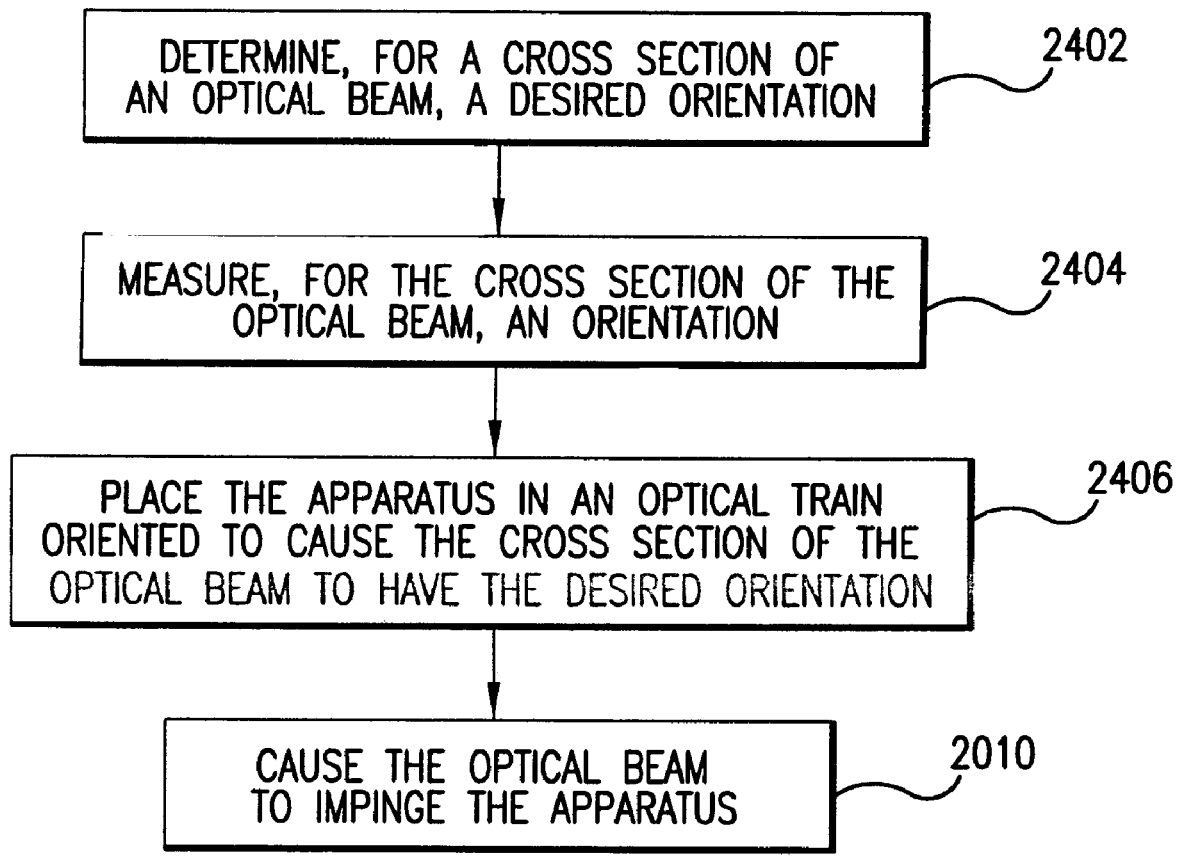
FIG. 24 shows a block diagram of a method of using the apparatus in an optical train to cause the cross section of the optical beam to have a desired orientation.

In another application, the apparatus of the present invention can be used to change an orientation of a cross section of an optical beam. FIG. 24 shows a block diagram of a method of using the apparatus in an optical train to cause the cross section of the optical beam to have a desired orientation. In FIG. 24, at an optional step 2402, a desired orientation for a cross section of an optical beam is determined. At an optional step 2404, an orientation for the cross section of the optical beam is measured. At a step 2406, the apparatus is placed in an optical train oriented to cause the cross section of the optical beam to have the desired orientation. At step 2010, the optical beam is made to impinge the apparatus, thereby changing the orientation of the cross section of the optical beam.

Figure 25:
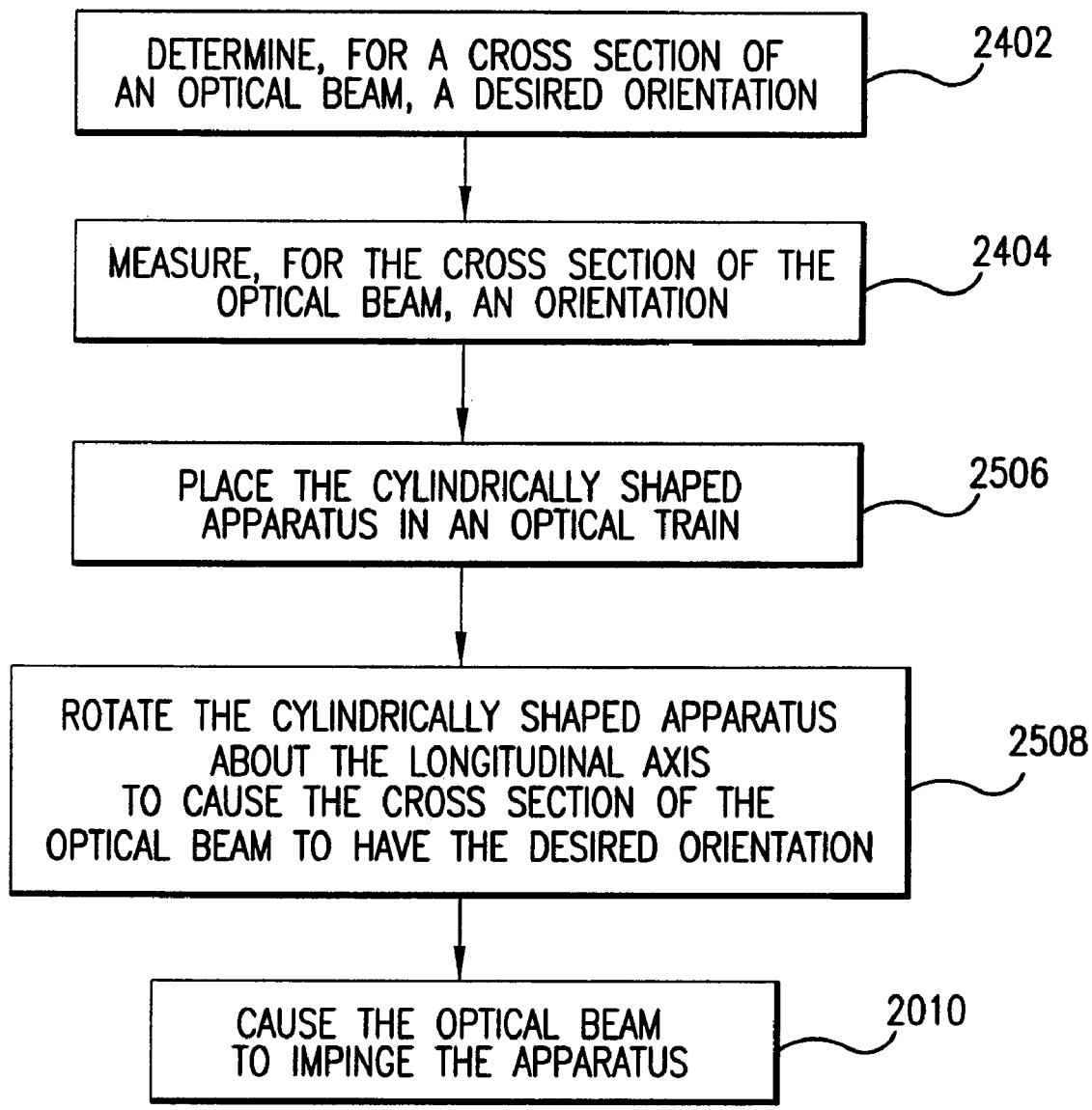
FIG. 25 shows a block diagram of the method of FIG. 24 with a cylindrically shaped apparatus.

FIG. 25 shows a block diagram of the method of FIG. 24 with a cylindrically shaped apparatus. In FIG. 25, at optional step 2402, a desired orientation for a cross section of an optical beam is determined. At optional step 2404, an orientation for the cross section of the optical beam is measured. At a step 2506, the cylindrically shaped apparatus is placed in an optical train. At a step 2508, the cylindrically shaped apparatus is rotated about its longitudinal axis to cause the cross section of the optical beam to have the desired orientation. At step 2010, the optical beam is made to impinge the apparatus, thereby changing the orientation of the cross section of the optical beam.

Figure 26:
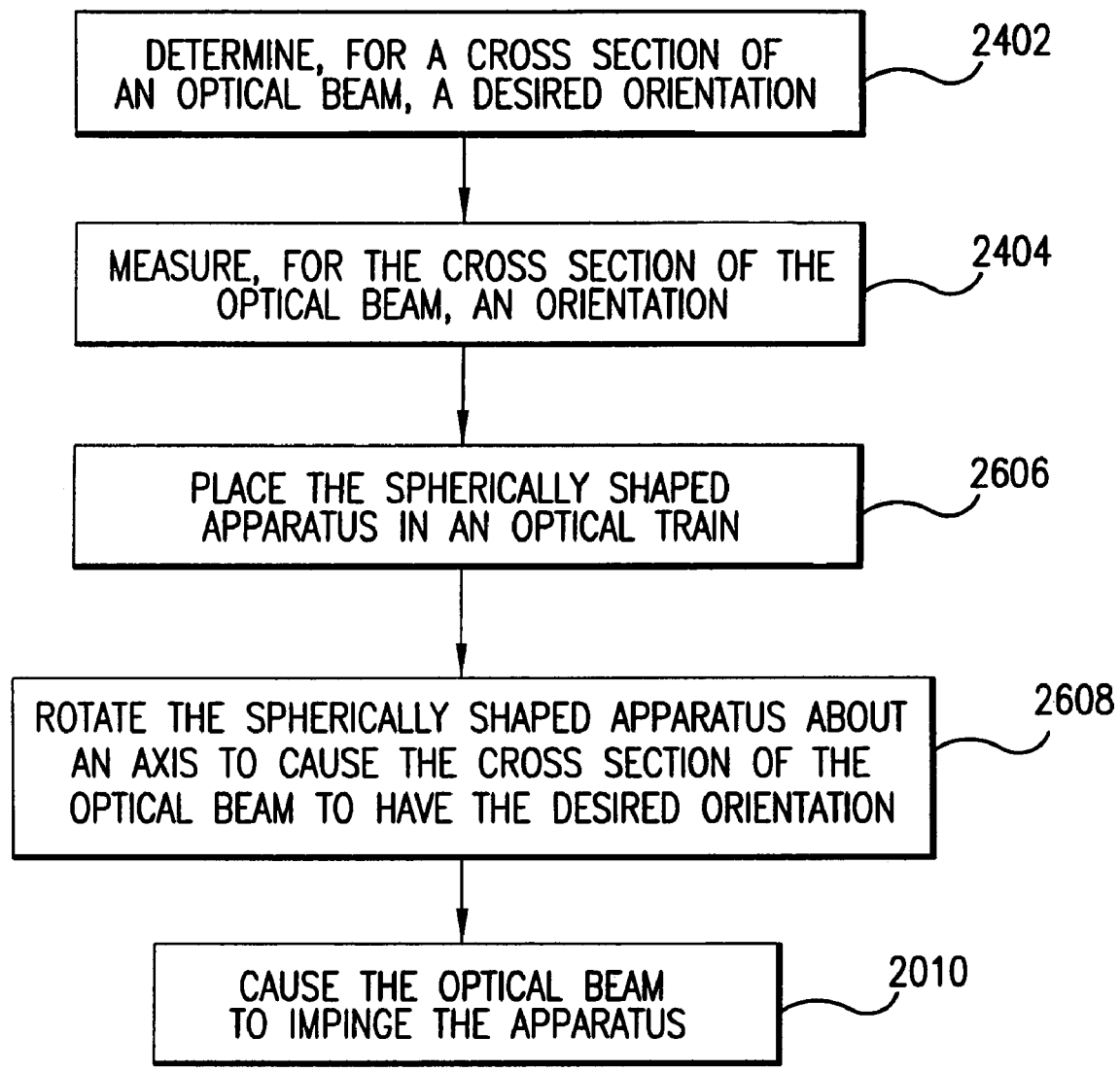
FIG. 26 shows a block diagram of the method of FIG. 24 with a spherically shaped apparatus.

FIG. 26 shows a block diagram of the method of FIG. 24 with a spherically shaped apparatus. In FIG. 26, at optional step 2402, a desired orientation for a cross section of an optical beam is determined. At optional step 2404, an orientation for the cross section of the optical beam is measured. At a step 2606, the spherically shaped apparatus is placed in an optical train. At a step 2608, the spherically shaped apparatus is rotated about an axis to cause the cross section of the optical beam to have the desired orientation. At step 2010, the optical beam is made to impinge the apparatus, thereby changing the orientation of the cross section of the optical beam.

Figure 27:
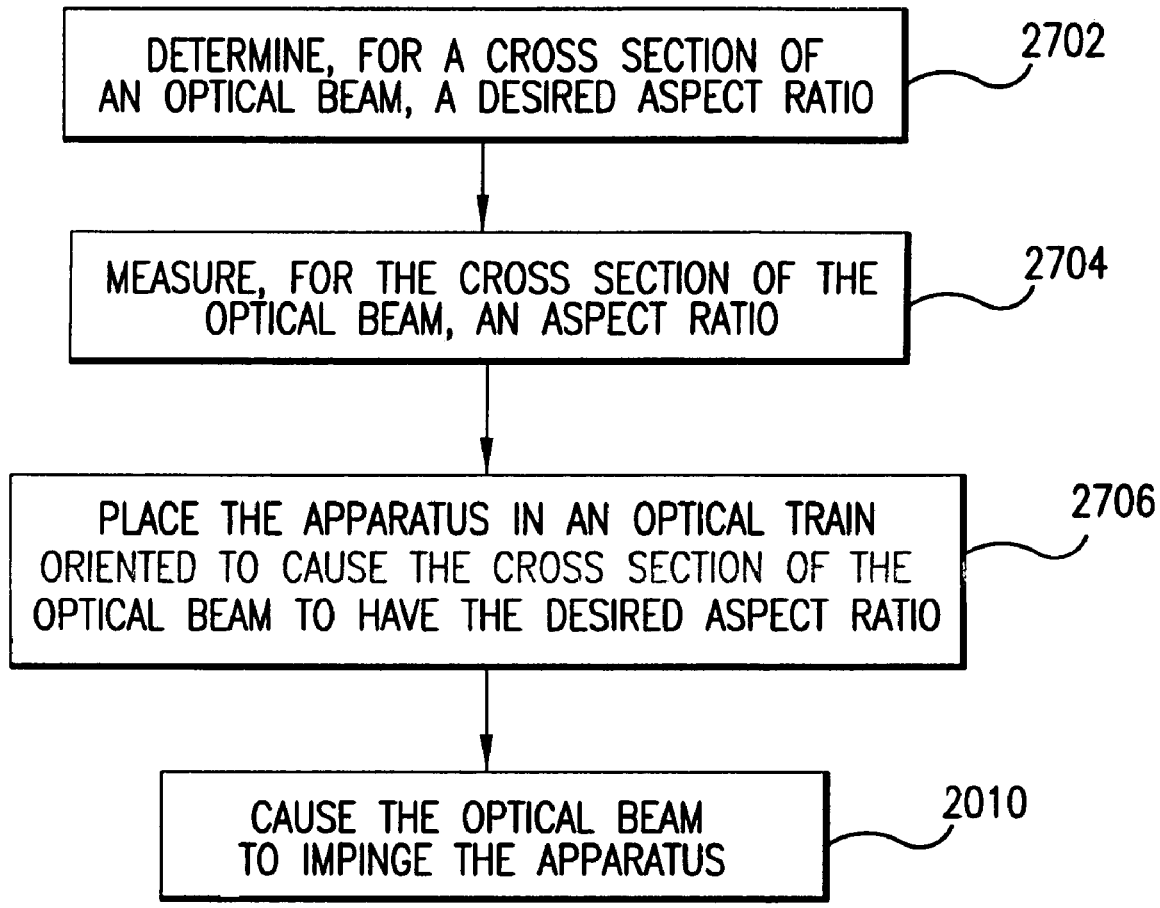
FIG. 27 shows a block diagram of a method of using the apparatus in an optical train to cause the cross section of the optical beam to have a desired aspect ratio.

In another application, the apparatus of the present invention can be used to change an aspect ratio of a cross section of an optical beam. FIG. 27 shows a block diagram of a method of using the apparatus in an optical train to cause the cross section of the optical beam to have a desired aspect ratio. In FIG. 27, at an optional step 2702, a desired aspect ratio for a cross section of an optical beam is determined. At an optional step 2704, an aspect ratio for the cross section of the optical beam is measured. At a step 2706, the apparatus is placed in an optical train oriented to cause the cross section of the optical beam to have the desired aspect ratio. At step 2010, the optical beam is made to impinge the apparatus, thereby changing the aspect ratio of the cross section of the optical beam.

Figure 28:
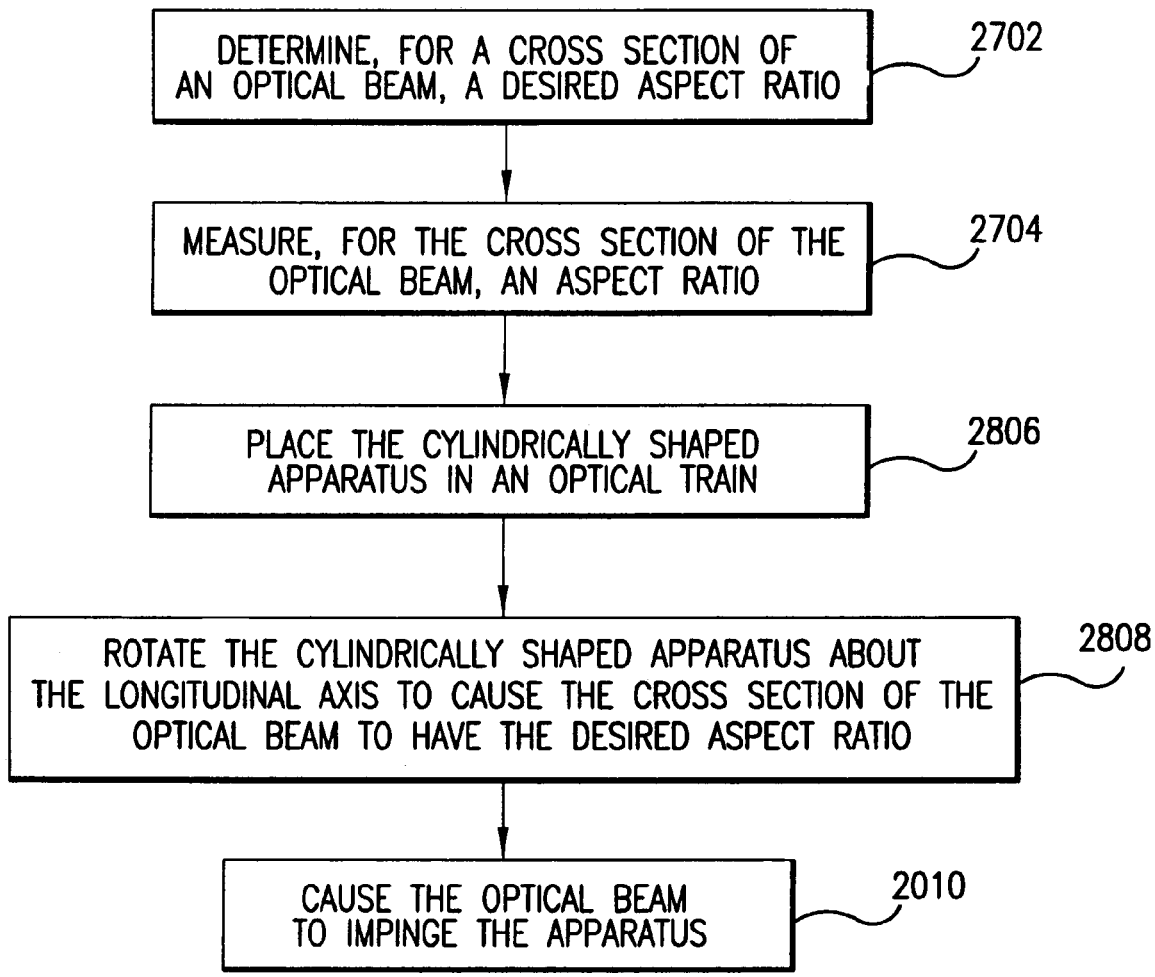
FIG. 28 shows a block diagram of the method of FIG. 27 with a cylindrically shaped apparatus.

FIG. 28 shows a block diagram of the method of FIG. 27 with a cylindrically shaped apparatus. In FIG. 28, at optional step 2702, a desired aspect ratio for a cross section of an optical beam is determined. At optional step 2704, an aspect ratio for the cross section of the optical beam is measured. At a step 2806, the cylindrically shaped apparatus is placed in an optical train. At a step 2808, the cylindrically shaped apparatus is rotated about its longitudinal axis to cause the cross section of the optical beam to have the desired aspect ratio. At step 2010, the optical beam is made to impinge the apparatus, thereby changing the aspect ratio of the cross section of the optical beam.

Figure 29:
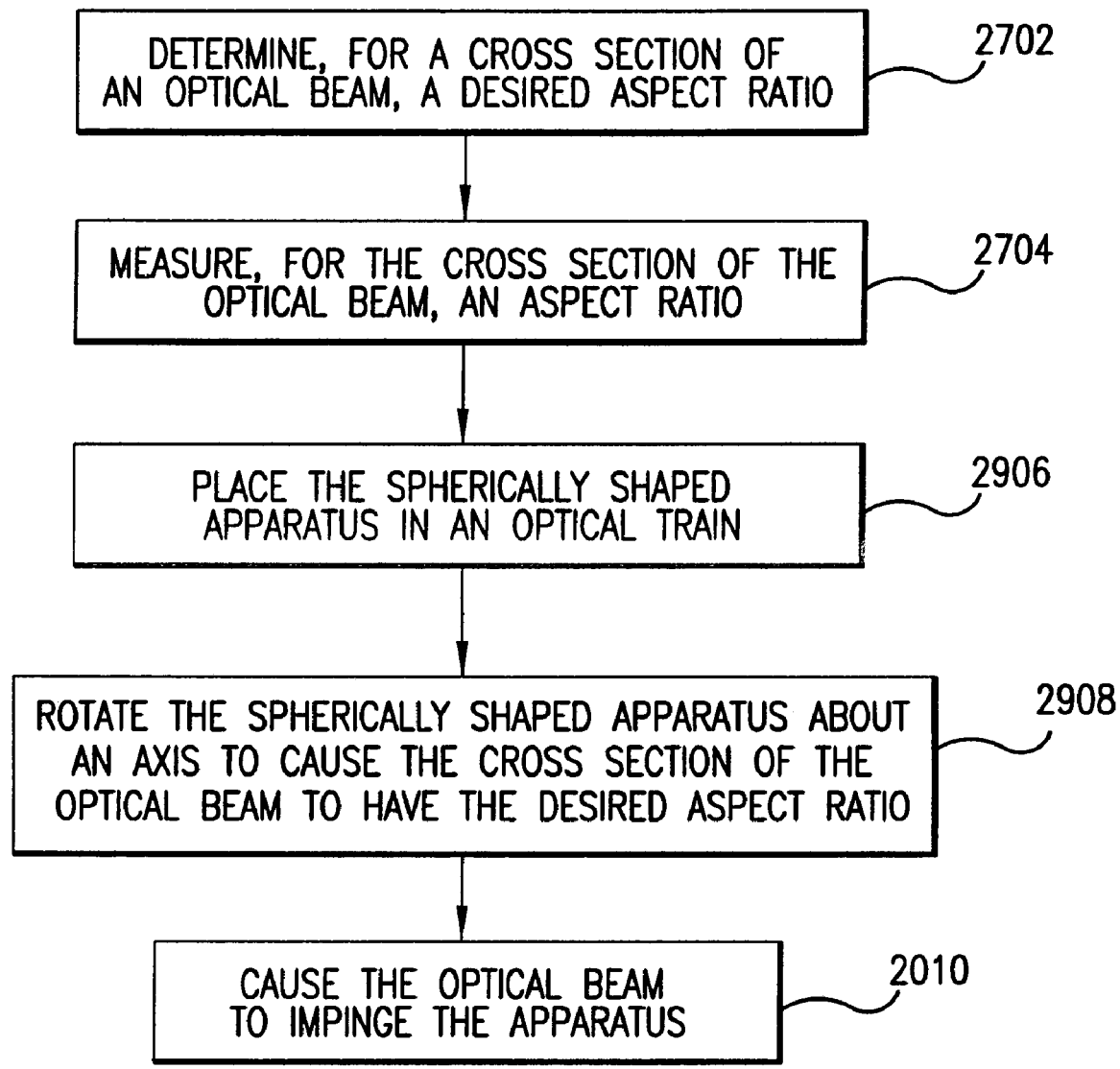
FIG. 29 shows a block diagram of the method of FIG. 27 with a spherically shaped apparatus.

FIG. 29 shows a block diagram of the method of FIG. 27 with a spherically shaped apparatus. In FIG. 29, at optional step 2702, a desired aspect ratio for a cross section of an optical beam is determined. At optional step 2704, an aspect ratio for the cross section of the optical beam is measured. At a step 2906, the spherically shaped apparatus is placed in an optical train. At a step 2908, the spherically shaped apparatus is rotated about an axis to cause the cross section of the optical beam to have the desired aspect ratio. At step 2010, the optical beam is made to impinge the apparatus, thereby changing the aspect ratio of the cross section of the optical beam.

Figure 30:
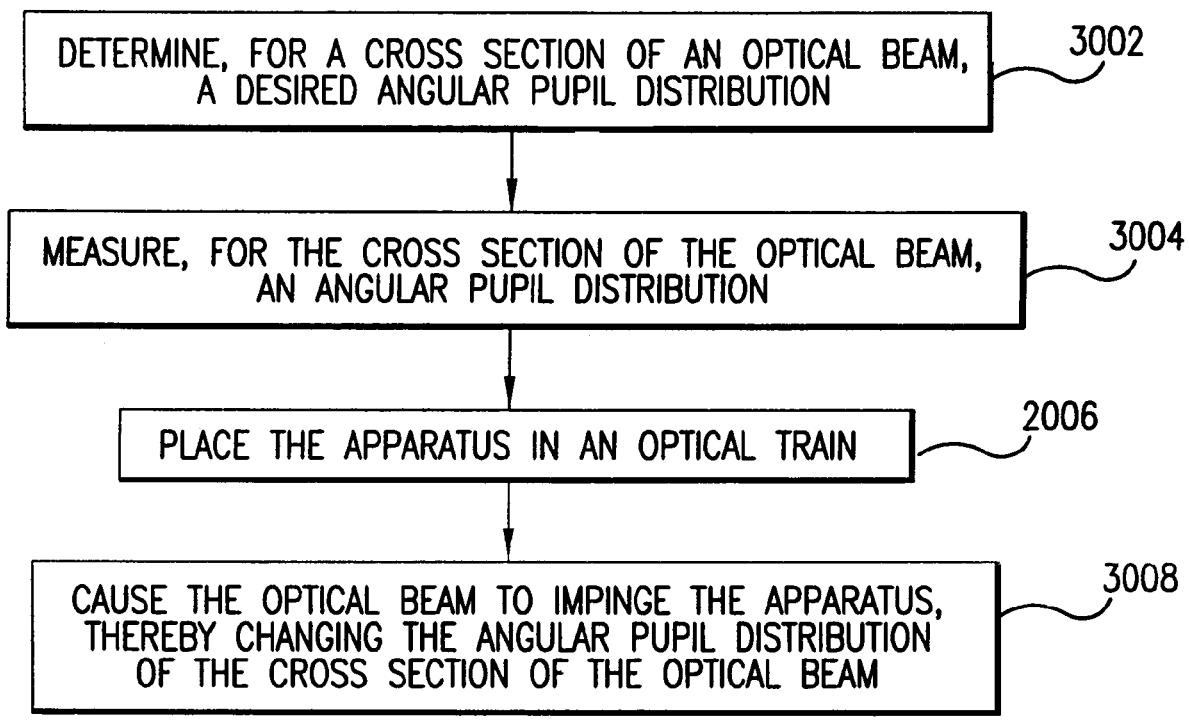
FIG. 30 shows a block diagram of a method of using the apparatus in an optical train to cause the cross section of the optical beam to have a desired angular pupil distribution.

In another application, the apparatus of the present invention can be used to change an angular distribution of a cross section of an optical beam. FIG. 30 shows a block diagram of a method of using the apparatus in an optical train to cause the cross section of the optical beam to have a desired angular pupil distribution. In FIG. 30, at an optional step 3002, a desired angular pupil distribution for a cross section of an optical beam is determined. At an optional step 3004, an angular pupil distribution for the cross section of the optical beam is measured. At step 2006, the apparatus is placed in an optical train. At a step 3008, the optical beam is made to impinge the apparatus, thereby changing the angular pupil distribution of the cross section of the optical beam.

Figure 31:
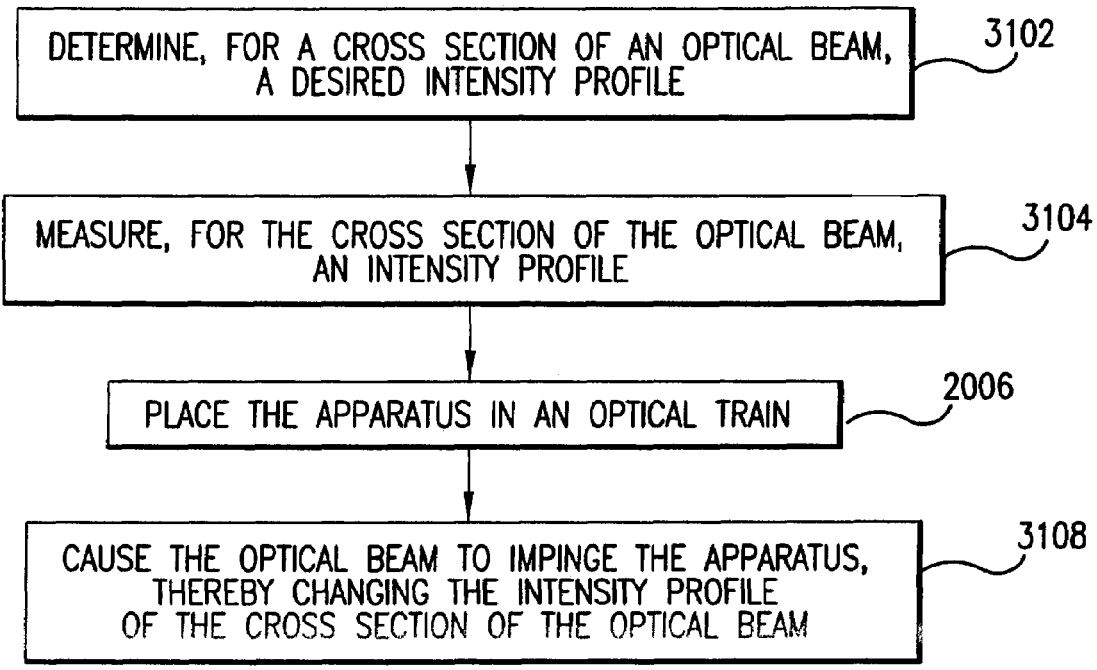
FIG. 31 shows a block diagram of a method of using the apparatus in an optical train to cause the cross section of the optical beam to have a desired intensity profile.

In another application, the apparatus of the present invention can be used to change an intensity profile of a cross section of an optical beam. FIG. 31 shows a block diagram of a method of using the apparatus in an optical train to cause the cross section of the optical beam to have a desired intensity profile. In FIG. 31, at an optional step 3102, a desired intensity profile for a cross section of an optical beam is determined. At an optional step 3104, an intensity profile for the cross section of the optical beam is measured. At step 2006, the apparatus is placed in an optical train. At a step 3108, the optical beam is made to impinge the apparatus, thereby changing the intensity profile of the cross section of the optical beam.

Figure 32:
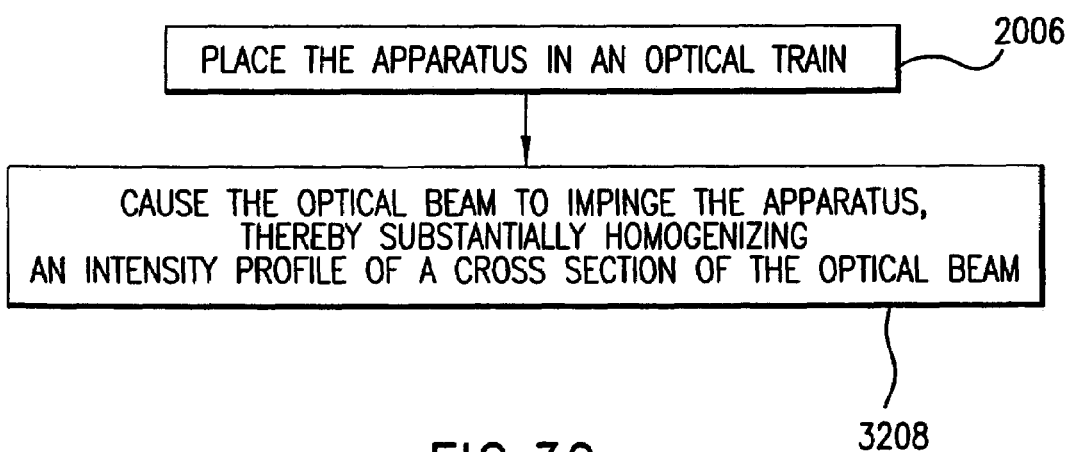
FIG. 32 shows a block diagram of a method of using the apparatus in an optical train to homogenize substantially an intensity profile of the cross section of the optical beam.

In another application, the apparatus of the present invention can be used to homogenize substantially an intensity profile of a cross section of an optical beam. FIG. 32 shows a block diagram of a method of using the apparatus in an optical train to homogenize substantially an intensity profile of the cross section of the optical beam. In FIG. 32, at step 2006, the apparatus is placed in an optical train. At a step 3208, the optical beam is made to impinge the apparatus, thereby substantially homogenizing the intensity profile of the cross section of the optical beam.

CONCLUSION

While embodiments of the present invention have been described above, it should be understood that they have been presented by way of example only, and not limitation. It will be understood by those skilled in the art that various changes in form and detail may be made therein without departing from the spirit and scope of the invention as defined in the appended claims. Thus, the breadth and scope of the present invention should not be limited by the above-described embodiments, but should be defined only in accordance with the following claims and their equivalents.

What is claimed is:

1. An apparatus for optical beam shaping and diffusing, comprising an object made of a single crystalline material having crystal lattice axes, wherein a portion of a surface of said object includes a pattern of texture configured so that, when said object is rotated about an axis of said crystal lattice axes and an optical beam impinges said portion, an angular orientation of a cross section of the optical beam changes while an aspect ratio of the cross section of the optical beam is maintained.

2. The apparatus of claim 1, wherein said object has a substantially cylindrical shape, and wherein a longitudinal axis of said object corresponds to said axis of said crystal lattice axes.

3. An apparatus for optical beam shaping and diffusing, comprising an object made of a single crystalline material, wherein a portion of a surface of said object includes a pattern of texture configured so that, when said object is rotated about an axis of said crystal lattice axes and an optical beam impinges said portion, an aspect ratio of the a cross section of the optical beam changes while an angular orientation of the cross section of the optical beam is maintained.

4. The apparatus of claim 3, wherein said object has a substantially cylindrical shape, and wherein a longitudinal axis of said object corresponds to said axis of said crystal lattice axes.

5. An apparatus for optical beam shaping and diffusing, comprising an object made of a single crystalline material having crystal lattice axes, wherein a portion of a surface of said object includes a pattern of texture configured so that, when said object is rotated about a first axis of said crystal lattice axes and an optical beam impinges said portion, an angular orientation of a cross section of the optical beam changes, and when said object is rotated about a second axis of said crystal lattice axes and the optical beam impinges said portion, an aspect ratio of the cross section of the optical beam changes.

6. The apparatus of claim 5, wherein said object has a substantially spherical shape.

7. A method for making an apparatus for optical beam shaping and diffusing, comprising the steps of:
   (1) orientating crystal lattice axes within an object made of a single crystalline material, wherein an orientation of the crystal lattice axes is such that, when an optical beam impinges a portion of a surface of the object, one or more of aspect ratio and an angular orientation of a cross section of the optical beam changes;
   (2) forming a pattern of texture on the portion of the surface of the object; and
   (3) shaping the object to have a substantially cylindrical shape, wherein a longitudinal axis of the object coincides with an axis of the crystal lattice axes, and wherein the object is configured to be rotated about the longitudinal axis to change the angular orientation of the cross section of the optical beam while maintaining the aspect ratio of the cross section of the optical beam.

8. The method of claim 7, wherein the pattern of texture is determined using a Fourier Transform analysis.

9. A method for making an apparatus for optical beam shaping and diffusing, comprising the steps of:
   (1) orientating crystal lattice axes within an object made of a single crystalline material, wherein an orientation of the crystal lattice axes is such that, when an optical beam impinges a portion of a surface of the object, one or more of an aspect ratio and an angular orientation of a cross section of the optical beam changes;

(2) forming a pattern of texture on the portion of the surface of the object; and (3) shaping the object to have a substantially cylindrical shape, wherein a longitudinal axis of the object coincides with an axis of the crystal lattice axes, and wherein the object is configured to be rotated about the longitudinal axis to change the aspect ratio of the cross section of the optical beam while maintaining the angular orientation of the cross section of the optical beam.

10. The method of claim 9, wherein the pattern of texture is determined using a Fourier Transform analysis.

11. A method for making an apparatus for optical beam shaping and diffusing, comprising the steps of:

(1) orientating crystal lattice axes within an object made of a single crystalline material, wherein an orientation of the crystal lattice axes is such that, when an optical beam impinges a portion of a surface of the object, one or more of an aspect ratio and an angular orientation of a cross section of the optical beam changes;

(2) forming a pattern of texture on the portion of the surface of the object; and (3) shaping the object to have a substantially spherical shape, wherein a first axis of the object coincides with a first axis of the crystal lattice axes, wherein the object is configured to be rotated about the first axis of the object to change the angular orientation of the cross section of the optical beam, wherein a second axis of the object coincides with a second axis of the crystal lattice axes, and wherein the object is configured to be rotated about the second axis of the object to change the aspect ratio of the cross section of the optical beam.

12. The method of claim 11, wherein the pattern of texture is determined using a Fourier Transform analysis.

\* \* \* \* \*